(12) United States Patent
Wang et al.

(10) Patent No.: US 11,302,685 B2
(45) Date of Patent: Apr. 12, 2022

(54) FULLY-PRINTED STRETCHABLE THIN-FILM TRANSISTORS AND INTEGRATED LOGIC CIRCUITS

(71) Applicant: BOARD OF TRUSTEES OF MICHIGAN STATE UNIVERSITY, East Lansing, MI (US)

(72) Inventors: Chuan Wang, Haslett, MI (US); Le Cai, Los Angeles, CA (US)

(73) Assignee: BOARD OF TRUSTEES OF MICHIGAN STATE UNIVERSITY, East Lansing, MI (US)

( * ) Notice: Subject to any disclaimer, the term of this patent is extended or adjusted under 35 U.S.C. 154(b) by 0 days.

(21) Appl. No.: 16/195,004

(22) Filed: Nov. 19, 2018

(65) Prior Publication Data
US 2019/0157256 A1   May 23, 2019

Related U.S. Application Data

(60) Provisional application No. 62/588,005, filed on Nov. 17, 2017.

(51) Int. Cl.
*H01L 27/01* (2006.01)
*H01L 21/02* (2006.01)
(Continued)

(52) U.S. Cl.
CPC ...... *H01L 27/016* (2013.01); *H01L 21/02109* (2013.01); *H01L 21/02118* (2013.01);
(Continued)

(58) Field of Classification Search
CPC ......... H01L 29/4908; H01L 29/42684–42392; H01L 29/78645–78648; H01L 29/8126;
(Continued)

(56) References Cited

U.S. PATENT DOCUMENTS

| 2007/0215957 A1* | 9/2007 | Chen | H01L 51/0537 257/411 |
| 2008/0149922 A1* | 6/2008 | Lin | H01L 29/4908 257/E21.294 |

(Continued)

OTHER PUBLICATIONS

Sun et al. "Flexible high-performance carbon nanotube integrated circuits", Nature nanotechnology letters, vol. 6, Mar. 2011, pp. 156-161. (Year: 2011).*

(Continued)

*Primary Examiner* — Sonya McCall-Shepard
(74) *Attorney, Agent, or Firm* — Marshall, Gerstein & Borun LLP

(57) ABSTRACT

Printable and stretchable thin-film devices and fabrication techniques are provided for forming fully-printed, intrinsically stretchable thin-film transistors and integrated logic circuits using stretchable elastomer substrates such as polydimethylsiloxane (PDMS), semiconducting carbon nanotube network as channel, unsorted carbon nanotube network as source/drain/gate electrodes, and $BaTiO_3$/PDMS composite as gate dielectric. Printable stretchable dielectric layer ink may be formed by mixing barium titanate nanoparticle ($BaTiO_3$) with PDMS using 4-methyl-2-pentanone as solvent.

16 Claims, 17 Drawing Sheets

(51) Int. Cl.
| H01L 21/3105 | (2006.01) |
| H01L 21/84 | (2006.01) |
| H01L 23/538 | (2006.01) |
| H01L 27/12 | (2006.01) |
| H01L 29/49 | (2006.01) |
| H01L 29/51 | (2006.01) |
| H01L 51/00 | (2006.01) |
| H01L 51/05 | (2006.01) |
| H01L 51/10 | (2006.01) |
| H03K 19/21 | (2006.01) |

(52) U.S. Cl.
CPC .. *H01L 21/02126* (2013.01); *H01L 21/02288* (2013.01); *H01L 21/3105* (2013.01); *H01L 21/84* (2013.01); *H01L 23/5387* (2013.01); *H01L 27/1214* (2013.01); *H01L 29/4908* (2013.01); *H01L 29/517* (2013.01); *H01L 51/0048* (2013.01); *H01L 51/0097* (2013.01); *H01L 51/055* (2013.01); *H01L 51/0537* (2013.01); *H01L 51/105* (2013.01); *H03K 19/21* (2013.01)

(58) Field of Classification Search
CPC ......... H01L 29/78666; H01L 29/78675; H01L 29/66757; H01L 29/78669; H01L 29/78678; H01L 29/66765; H01L 21/823437–823456; H01L 21/823828–82385; H01L 29/42312–42392; H01L 29/49–4991; H01L 29/66515; H01L 29/66545; H01L 29/66787–66818; H01L 29/0669–068; H01L 29/0665; H01L 2924/13061; H01L 29/66439; H01L 29/66469; H01L 29/7853–2029/7858; H01L 29/78687; H01L 29/78696; Y10S 977/938
See application file for complete search history.

(56) References Cited

U.S. PATENT DOCUMENTS

| 2013/0092931 | A1* | 4/2013 | Knutson | H01L 29/66742 257/43 |
| 2017/0346013 | A1* | 11/2017 | Chung | H01L 51/0036 |
| 2018/0145259 | A1* | 5/2018 | Yamamoto | C08G 61/12 |
| 2018/0175297 | A1* | 6/2018 | Zhou | H01L 51/0003 |
| 2018/0323388 | A1* | 11/2018 | Li | H01L 51/0026 |
| 2019/0067609 | A1* | 2/2019 | Yan | H01L 51/0562 |
| 2020/0041434 | A1* | 2/2020 | Atluri | G01N 33/0047 |

OTHER PUBLICATIONS

Robinson et al. "Microstructured Silicone Substrate for Printable and Stretchable Metallic Films", Langmuir 2011, 27, 8, 4279-4284 (Year: 2011).*
Jiang et al. "Engineering of Amorphous Polymeric Insulators for Organic Field-Effect Transistors", Advanced Electronic Materials 2017, 3, 1700157 (Year: 2017).*
Ando et al., "All-Inkjet Printed Strain Sensors," IEEE Sensors Journal 13:4874-4879 (2013).
Bade et al., "Stretchable Light-Emitting Diodes with Organometal-Halide-Perovskite-Polymer Composite Emitters," Advanced Materials 29:1607053, 7 pages (2017).
Bae et al., "Roll-to-roll production of 30-inch graphene films for transparent electrodes," Nat Nano 5:574 (2010).
Bodas et al., "Formation of More Stable Hydrophilic Surfaces of PDMS by Plasma and Chemical Treatments," Microelectron. Eng. 83:1277-1279 (2006).
Bogue, "Nanomaterials for new and emerging physical sensing applications: a review of recent developments," Sensor Review 35:321-328 (2015).
Boberl et al., "Inkjet-Printed Nanocrystal Photodetectors Operating up to 3 μm Wavelengths," Advanced Materials 19:3574-3578 (2007).
Cai et al., "Carbon Nanotube Flexible and Stretchable Electronics," Nanoscale Res. Lett. 10:320 (2015).
Cai et al., "Fully Printed Foldable Integrated Logic Gates with Tunable Performance Using Semiconducting Carbon Nanotubes," Adv. Funct. Mater. 25:5698-5705 (2015).
Cai et al., "Fully Printed Stretchable Thin-Film Transistors and Integrated Logic Circuits," ACS Nano 10:11459-11468 (2016).
Cai et al., "Super-stretchable, Transparent Carbon Nanotube-Based Capacitive Strain Sensors for Human Motion Detection," Scientific Reports 3:3048, 9 pages (2013).
Cao et al., "Improving Contact Interfaces in Fully Printed Carbon Nanotube Thin-Film Transistors," ACS Nano 10:5221-5229 (2016).
Cao et al., "Screen Printing as a Scalable and Low-Cost Approach for Rigid and Flexible Thin-Film Transistors Using Separated Carbon Nanotubes," ACS Nano 8:12769-12776 (2014).
Chae et al., "Transferred Wrinkled Al2O3 for Highly Stretchable and Transparent Graphene-Carbon Nanotube Transistors," Nat. Mater. 12:403-409 (2013).
Chen et al., "Inkjet-printed transparent nanowire thin film features for UV photodetectors," RSC Advances 5:70707-70712 (2015).
Choi et al., "Recent developments and directions in printed nanomaterials," Nanoscale 7:3338, 18 pages (2015).
Chortos et al., "Mechanically Durable and Highly Stretchable Transistors Employing Carbon Nanotube Semiconductor and Electrodes," Adv. Mater. 28:4441-4448 (2016).
Chun et al., "Highly Conductive, Printable and Stretchable Composite Films of Carbon Nanotubes and Silver," Nat. Nanotechnol. 5:853-857 (2010).
Cohen et al., "A Highly Elastic, Capacitive Strain Gauge Based on Percolating Nanotube Networks," Nano Letters 12:5 pages (2012).
De Gans et al., "Inkjet Printing of Polymers: State of the Art and Future Developments," Advanced Materials 16:203-213(2004).
Derby, "Printing and Prototyping of Tissues and Scaffolds," Science 338:921-926 (2012).
Erk et al., "Strain Stiffening in Synthetic and Biopolymer Networks," Biomacromolecules 11:1358-1363 (2010).
Finn et al., "Inkjet Printing of Silver Nanowire Networks," ACS Applied Materials & Interfaces, 7:9254-9261 (2015).
Fratzl et al., "Biomaterial systems for mechanosensing and actuation," Nature 462:442-448 (2009).
Goncharenko et al., "Lichtenecker's Equation: Applicability and Limitations," Opt. Commun. 174:19-32 (2000).
Hammock et al., "25th Anniversary Article: The Evolution of Electronic Skin (E-Skin): A Brief History, Design Considerations, and Recent Progress," Advanced Materials 25: 5997-6037 (2013).
Itkis et al., "Purity Evaluation of as-Prepared Single-Walled Carbon Nanotube Soot by Use of Solution-Phase near-Ir Spectroscopy," Nano Lett. 3:309-314 (2003).
Jang et al., "Graphene-Based Flexible and Stretchable Electronics," Adv. Mater. 28:4184-4202 (2016).
Kamyshny et al., "Conductive Nanomaterials for Printed Electronics," Small 10:3515-3535 (2014).
Kang et al., "Bioresorbable silicon electronic sensors for the brain," Nature 530:71-76 (2016).
Kang et al., "Capillary Printing of Highly Aligned Silver Nanowire Transparent Electrodes for High-Performance Optoelectronic Devices," Nano Letters 15:7933-7942 (2015).
Kang et al., "Ultrasensitive mechanical crack-based sensor inspired by the spider sensory system," Nature 516:222 (2014).
Kenry et al., "Emerging flexible and wearable physical sensing platforms for healthcare and biomedical applications," Microsystems & Nanoengineering 2:16043 (2016).
Kim et al., "Effect of surface tension and coefficient of thermal expansion in 30 nm scale nanoimprinting with two flexible polymer molds," Nanotechnology 23:235303, 9 pages (2012).
Kim et al., "Electrolyte-Gated Transistors for Organic and Printed Electronics," Adv. Mater. 25:1822-1846 (2013).
Kim et al., "Epidermal Electronics," Science 333:838-843 (2011).

(56) References Cited

OTHER PUBLICATIONS

Kim et al., "Materials and noncoplanar mesh designs for integrated circuits with linear elastic responses to extreme mechanical deformations," PNAS 105:18675-18680 (2008).
Kim et al., "Stretchable and Foldable Silicon Integrated Circuits," Science 320:507-511 (2008).
Kim et al., "Stretchable Nanoparticle Conductors with Self-Organized Conductive Pathways," Nature 500:59-63 (2013).
Kim et al., "Stretchable, Curvilinear Electronics Based on Inorganic Materials," Adv. Mater. 22:2108-2124 (2010).
Kim et al., "Waterproof AlinGaP Optoelectronics on Stretchable Substrates with Applications in Biomedicine and Robotics," Nat. Mater. 9:929-937 (2010).
Larson et al., "Highly stretchable electroluminescent skin for optical signaling and tactile sensing," Science 351:1071-1074 (2016).
Lau et al., "Fully Printed, High Performance Carbon Nanotube Thin-Film Transistors on Flexible Substrates," Nano Lett. 13:3864-3869 (2013).
Lee et al., "Direct Alignment and Patterning of Silver Nanowires by Electrohydrodynamic Jet Printing," Small 10:3918-3922 (2014).
Lee et al., "Highly Stretchable and Highly Conductive Metal Electrode by Very Long Metal Nanowire Percolation Network" Advanced Materials 24:3326-3332 (2012).
Lee et al., "Stretchable Graphene Transistors with Printed Dielectrics and Gate Electrodes," Nano Lett. 11:4642-4646 (2011).
Li et al., "Inkjet Printing of 2D Layered Materials," ChemPhysChem 15:3427-3434 (2014).
Liang et al., "Elastomeric Polymer Light-Emitting Devices and Displays," Nat. Photonics, 7:817-824 (2013).
Liang et al., "Intrinsically Stretchable and Transparent Thin-Film Transistors Based on Printable Silver Nanowires, Carbon Nanotubes and an Elastomeric Dielectric," Nat. Commun.6:7647, 10 pages (2015).
Lipomi et al., "Electronic Properties of Transparent Conductive Films of PEDOT:PSS on Stretchable Substrates," Chem. Mater. 24:373-382 (2012).
Lipomi et al., "Skin-Like Pressure and Strain Sensors Based on Transparent Elastic Films of Carbon Nanotubes," Nat. Nanotechnol. 6:788-792 (2011).
Liu et al., "Thickness-Gradient Films for High Gauge Factor Stretchable Strain Sensors," Advanced Materials 27:6230-6237 (2015).
Mannsfeld et al., "Highly Sensitive Flexible Pressure Sensors with Microstructured Rubber Dielectric Layers," Nat. Mater.9:859-864 (2010).
Matsuhisa et al., "Printable Elastic Conductors with a High Conductivity for Electronic Textile Applications," Nat. Commun. 6:7461, 11 pages (2015).
Mattmann et al., "Sensor for Measuring Strain in Textile," Sensors 8:3719-3732 (2008).
Moon et al., "Effect of Contact Angle and Drop Spacing on the Bulging Frequency of Inkjet-Printed Silver Lines on Fc-Coated Glass," J. Meeh. Sci. Technol. 28:1441-1448 (2014).
Muth et al., "Embedded 3D Printing of Strain Sensors within Highly Stretchable Elastomers," Advanced Materials 26:6307-6312 (2014).
Obitayo et al., "A Review: Carbon Nanotube-Based Piezoresistive Strain Sensors," Journal of Sensors 2012:15 pages (2012).
Ortiz et al., "High-K Organic, Inorganic, and Hybrid Dielectrics for Low-Voltage Organic Field-Effect Transistors," Chem. Rev. 110:205-239 (2009).
Pang et al., "A flexible and highly sensitive strain-gauge sensor using reversible interlocking of nanofibres," Nature Materials 11:795-801 (2012).
Pu et al., "Fabrication of Stretchable Mos2 Thin-Film Transistors Using Elastic Ion-Gel Gate Dielectrics," Appl. Phys. Lett. 103:023505 (2013).
Rogers et al., "Materials and Mechanics for Stretchable Electronics," Science 327:1603-1607 (2010).
Sekiguchi et al., "Robust and Soft Elastomeric Electronics Tolerant to Our Daily Lives," Nano Lett. 15:5716-5723 (2015).
Sekitani et al., "A Rubberlike Stretchable Active Matrix Using Elastic Conductors," Science 321:1468-1472 (2008).
Sekitani et al., "Stretchable Active-Matrix Organic Light-Emitting Diode Display Using Printable Elastic Conductors," Nat. Mater. 8:494-499 (2009).
Sekitani et al., "Stretchable, Large-Area Organic Electronics," Adv. Mater. 22:2228-2246 (2010).
Shin et al., "Polythiophene Nanofibril Bundles Surface-Embedded in Elastomer: A Route to a Highly Stretchable Active Channel Layer," Adv. Mater. 27:1255-1261 (2015).
Shin et al., "Stretchable Field-Effect-Transistor Array of Suspended $SnO_2$ Nanowires," Small 7:1181-1185 (2011).
Singh et al., "Inkjet Printing—Process and Its Applications," Advanced Materials 22:673-685 (2010).
Someya et al., "Conformable, Flexible, Large-Area Networks of Pressure and Thermal Sensors with Organic Transistor Active Matrixes," Proc. Natl. Acad. Sci. U.S.A. 102:12321-12325 (2005).
Taha et al., "Controlled Deposition of Gold Nanowires on Semiconducting and Nonconducting Surfaces," Nano Letters 7(7):1883-1887 (2007).
Vij, Handbook of Electroluminescent materials, IOP Publishing Ltd, London (2004).
Wang et al., "Dispersing Single-Walled Carbon Nanotubes with Surfactants: A Small Angle Neutron Scattering Study," Nano Lett. 4:1789-1793 (2004).
Wang et al., "Highly Stretchable and Self-Deformable Alternating Current Electroluminescent Devices," Advanced Materials 27:2876-2882 (2015).
Xu et al. "Highly Stretchable Carbon Nanotube Transistors with Ion Gel Gate Dielectrics," Nano Lett. 14: 682-686 (2014).
Xu et al., "Highly Conductive and Stretchable Silver Nanowire Conductors," Adv. Mater. 24:5117-5122 (2012).
Yamada et al., "A Stretchable Carbon Nanotube Strain Sensor for Human-Motion Detection," Nat. Nanotechnol. 6:296-301 (2011).
Yang et al., "Electroluminescence of Giant Stretchability," Advanced Materials 28:4480-4484 (2015).
Yang et al., "Microchannel Wetting for Controllable Patterning and Alignment of Silver Nanowire with High Resolution," ACS Applied Materials & Interfaces 7: 21433-21441 (2015).
Yao et al., "Nanomaterial-Enabled Stretchable Conductors: Strategies, Materials and Devices," Adv. Mater. 27:1480-1511 (2015).
Yao et al., "Wearable multifunctional sensors using printed stretchable conductors made of silver nanowires," Nanoscale 6:2345-2352 (2014).
Yu et al., "Highly Flexible Silver Nanowire Electrodes for Shape-Memory Polymer Light-Emitting Diodes," Advanced Materials 23:664-668 (2011).
Yuan et al., "Giant Dielectric Permittivity Nanocomposites: Realizing True Potential of Pristine Carbon Nanotubes in Polyvinylidene Fluoride Matrix through an Enhanced Interfacial Interaction," J. Phys. Chem. C 115:5515-5521 (2011).

\* cited by examiner

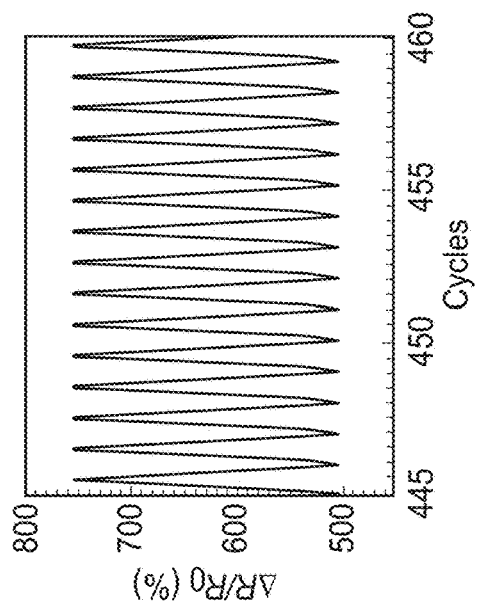
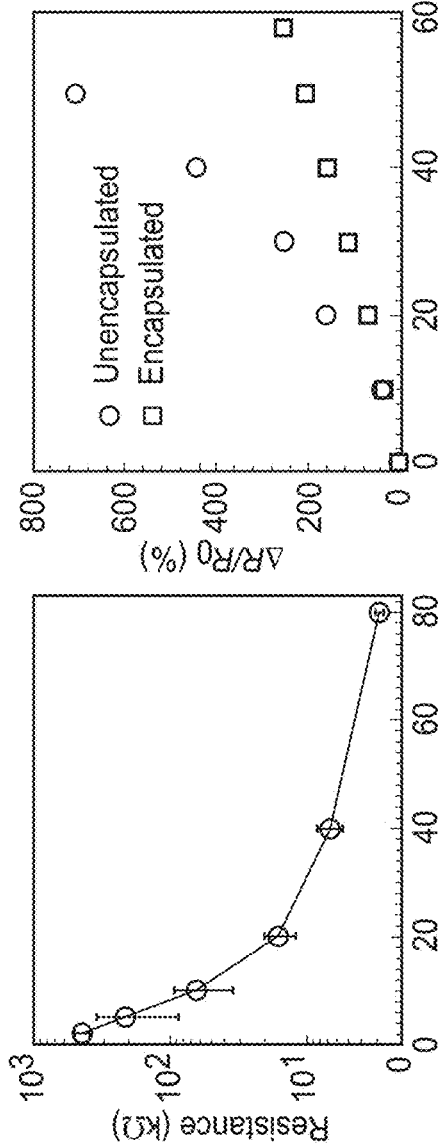
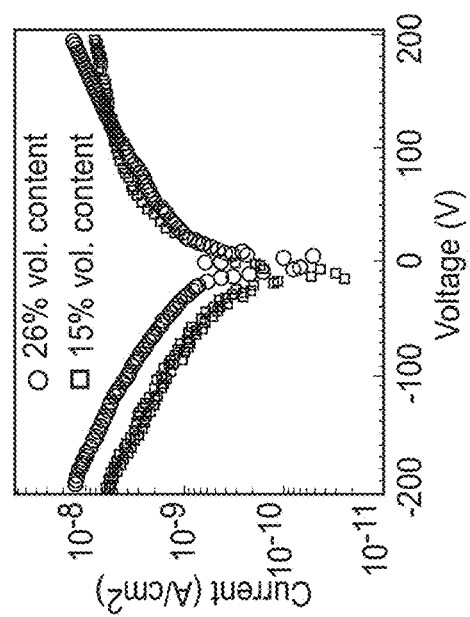
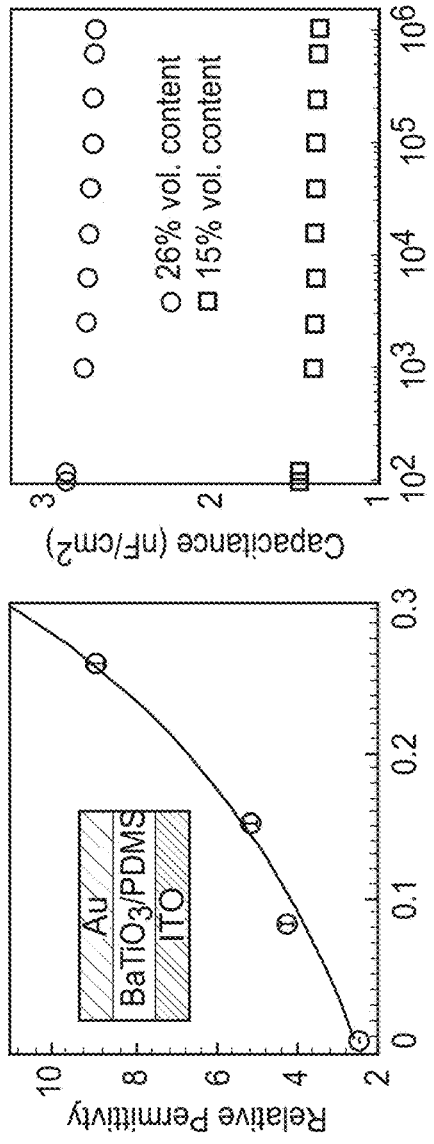
Figure 2A  Figure 2B  Figure 2C
Figure 2D  Figure 2E  Figure 2F

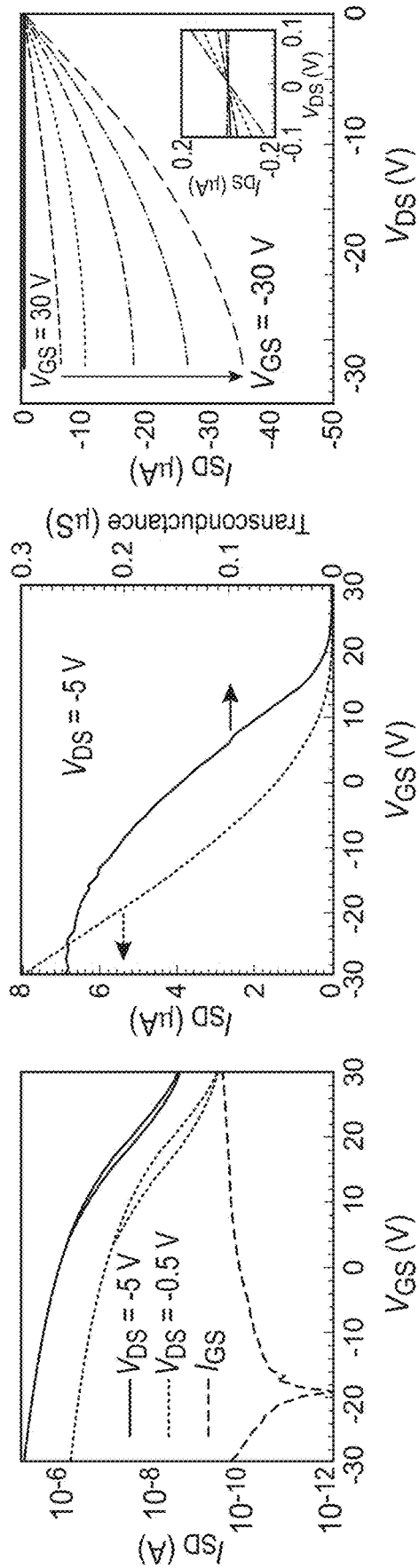

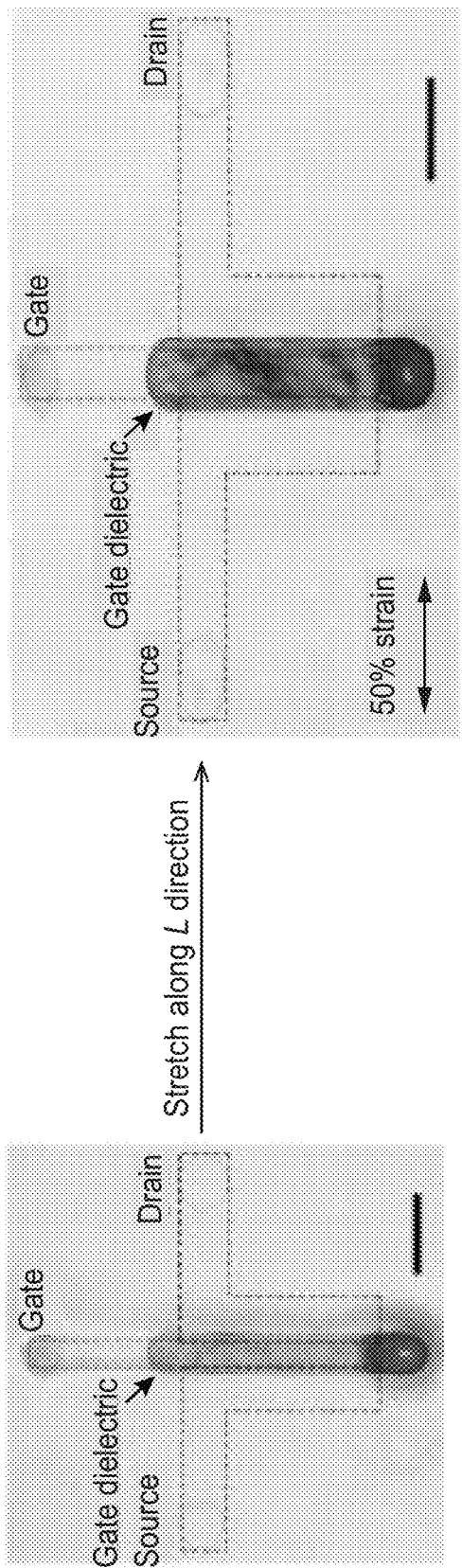
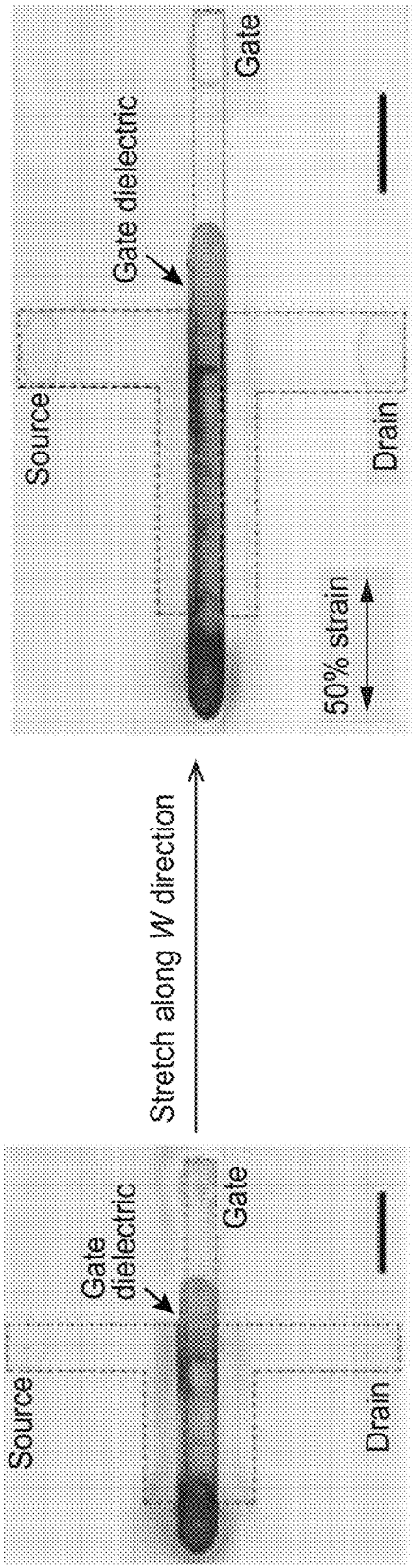
Figure 5A
Figure 5B

FULLY-PRINTED STRETCHABLE THIN-FILM TRANSISTORS AND INTEGRATED LOGIC CIRCUITS

CROSS-REFERENCE TO RELATED APPLICATIONS

This application claims the benefit of U.S. Provisional Application Ser. No. 62/588,005, filed Nov. 17, 2017, entitled "Fully-Printed Stretchable Thin-Film Transistors And Integrated Logic Circuits" the entirety of which is hereby incorporated herein by reference.

STATEMENT OF GOVERNMENT INTEREST

This invention was made with support under ECCS1549888 awarded by the National Science Foundation. The government has certain rights in the invention.

FIELD OF THE INVENTION

The present disclosure relates generally to thin-film devices and, more particularly, to printable, intrinsically stretchable thin-film devices and fabrication techniques.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Stretchable electronic systems built on soft substrates offer more conformal surface coverage and better durability than flexible electronics. Stretchable electronic systems have generated significant research interests recently for potential applications in wearable/implantable health monitoring and diagnostic devices, electronic skin for prosthesis or soft robotics, and stretchable displays, for example. Nevertheless, the large-area and low-cost fabrication of high-performance intrinsically stretchable electronic devices has remained extremely difficult. Researchers face a number of technical challenges when trying to develop large-area stretchable electronics. There are no reliable high-performance and robust stretchable electronic material platforms. Scalable and low-cost fabrication processes do not exist. And, there are no mechanisms to integrate standalone stretchable devices into functional systems.

Stretchable electronics are generally realized through two approaches: structural stretchability enabled by the use of buckling or serpentine structures in stiffened materials; or intrinsic stretchability endowed by new elastomeric or composite materials.

The first structural engineering approach utilizes high performance rigid semiconductors (e.g. silicon or III-V materials) and conventional cleanroom-based microfabrication processes. The approach has led to the demonstration of numerous types of sophisticated stretchable electronic systems. Yet, despite some success, this first approach appears unsuitable for large-area applications due to high manufacturing cost. Moreover, only a fraction of the area is actually occupied by active devices, while the rest of the area is filled with voids, and is thus wasted.

On the other hand, the second approach, i.e., using intrinsically stretchable materials, is of particular interest because intrinsically stretchable materials are usually solution processible and even printable. Thus, intrinsically stretchable materials are potentially suitable for large-area and cost-effective manufacturing. A number of new materials intrinsically stretchable materials have been explored, among them silver nanowires, carbon nanotubes, graphene, conductive polymers, and organic semiconductors. Intrinsically stretchable thin-film transistors (TFTs) have been demonstrated by a variety of approaches based on these materials. However, printing has never been used as the fabrication process and all previous reports were only limited to proof-of-concept level demonstrations of individual transistors.

SUMMARY OF THE INVENTION

The present application describes printed, intrinsically stretchable thin-film devices and fabrication techniques. These techniques may be used to form fully-printed, intrinsically stretchable thin-film transistors and integrated logic circuits, for example. In exemplary embodiments, stretchable polydimethylsiloxane (PDMS) substrates are formed with thin-film transistors elements, themselves formed of carbon nanotubes (CNTs). Transistor electrodes may be formed with stretchable dielectrics, for example, by printing the transistor electrodes and elements on the PDMS substrate.

In accordance with an example, a thin-film device comprises: a stretchable polydimethylsiloxane (PDMS) substrate; and one or more thin-film transistor elements having a source, a drain, and/or a gate electrode formed of carbon nanotubes (CNTs) and having a stretchable hybrid gate dielectric, the one or more thin-film transistor elements being printed on the PDMS substrate and forming one or more stretchable thin-film transistor elements.

In accordance with another example, a thin-film device comprises: a stretchable elastomer substrate; and one or more thin-film transistor elements having a source, a drain, and/or a gate electrode formed of carbon nanotubes (CNTs) and having a stretchable hybrid gate dielectric, the one or more thin-film transistor elements being printed on the stretchable elastomer substrate and forming one or more stretchable thin-film transistor elements.

In accordance with another example, a method of formulating a printable stretchable dielectric layer ink, the method comprises: mixing barium titanate nanoparticles ($BaTiO_3$) with polydimethylsiloxane (PDMS) and 4-methyl-2-pentanone to form the printable stretchable dielectric layer ink. In other examples, formulating a printable stretchable dielectric layer ink includes mixing other nanoparticles with high dielectric constant in place of $BaTiO_3$ with the PDMS, nanoparticles such as strontium titanate nanoparticles ($SrTiO_3$), titanate nanoparticles ($TiO_2$), hafnium dioxide ($HfO_2$), zirconium dioxide ($ZrO_2$), tantalum pentoxide ($Ta_2O_5$), etc.

In accordance an another example, a method of formulating a printable stretchable dielectric layer ink comprises: mixing nanoparticles with high dielectric constant with a stretchable elastomer oligomer in a suitable solvent to form the printable stretchable dielectric ink. In some examples, the nanoparticles with high dielectric constant comprises strontium titanate (SrTiO3) nanoparticles, titanate (TiO2) nanoparticles, hafnium dioxide (HfO2) nanoparticles, zirconium dioxide (ZrO2) nanoparticles, or tantalum pentoxide (Ta2O5) nanoparticles. In some examples, the stretchable elastomer oligomer comprises polydimethylsiloxane (PDMS), silicone, polyurethaneacrylate (PUA) substrate, or thermoplastic elastomer (TPE).

In accordance with another example, a method of forming stretchable thin-film transistor elements using printing, the method comprises: mixing polydimethylsiloxane (PDMS), barium titanate nanoparticles ($BaTiO_3$), and 4-methyl-2-pentanone to form a mixture and performing magnetic stirring on the mixture; subjecting the magnetic stirred mixture to successive bath sonication and probe sonication to break aggregations of $BaTiO_3$ to form a stretchable dielectric ink; providing an O2 plasma treatment to a surface of a PDMS substrate to render the PDMS substrate hydrophilic, and functionalizing the PDMS substrate with poly-L-lysine; depositing a semiconducting carbon nanotube network on the PDMS substrate using drop-casting; rinsing the PDMS substrate with deionized water to remove excessive surfactant followed by blow dry with N2; patterning source electrode and drain electrode by printing the stretchable dielectric ink on the substrate for 40~50 layers at 60° C. using a microplotter equipped with micropipettes; defining a channel between the source electrode and the drain electrode by patterning a semiconducting single-walled carbon nanotubes (sSWCNT) network by O2 plasma etching; performing an acetone rinsing; and printing a $PDMS/BaTiO_3$ gate dielectric and curing the $PDMS/BaTiO_3$ gate dielectric; printing the stretchable dielectric ink on the $PDMS/BaTiO_3$ gate dielectric for 20-30 layers at 60° C.; and encapsulating the resulting structure.

BRIEF DESCRIPTION OF THE DRAWINGS

The figures described below depict various aspects of the system and methods disclosed herein. It should be understood that each figure depicts an example of aspects of the present systems and methods.

FIG. 1A is a schematic illustrating the structure of a printed stretchable TFT, in accordance with an example. Unsorted carbon nanotubes, high purity semiconducting single-walled carbon nanotubes (sSWCNT) and $BaTiO_3$(Barium titanate)/PDMS(polydimethylsiloxane) composite were used as the source/drain/gate electrodes, channel semiconductor, and gate dielectric, respectively. FIG. 1BB is an optical micrograph of a TFT printed on a PDMS substrate. FIGS. 1C, 1D, and 1E are scanning electron micrographs of the carbon nanotube network in the source/drain electrodes (FIG. 1C) and channel (FIG. 1D), and atomic force micrograph of the $BaTiO_3$/PDMS gate dielectric (FIG. 1E). FIG. 1F is an optical photograph of a representative sample of four TFTs, a resistive load inverter, and a resistive load 2-input NOR gate and NAND gate, at tensile strains of 0% (top), ~25% (middle) and ~50% (bottom).

FIGS. 2A-2I illustrate characteristics of the printed CNT electrodes and $BaTiO_3$/PDMS gate dielectric, in accordance with an example implementation. FIG. 2A illustrates resistance of CNT features (length ~6 mm, width ~0.5 mm) printed on PDMS as a function of the number of printing runs. The error bars are standard deviations obtained from more than five samples. FIG. 2B illustrates relative change in resistance ($\Delta R/R_0$) as functions of tensile strain for CNT features with (squares) and without (circles) PDMS encapsulation layer. FIG. 2C illustrates $\Delta R/R_0$ of a printed CNT feature (with PDMS encapsulation) when a sample is being repeatedly stretched between 0% and 60% strain. FIG. 2D illustrates relative permittivity of the composite gate dielectric as a function of the volume content of $BaTiO_3$ nanoparticles measured from parallel plate capacitors fabricated on glass substrate. The error bars are standard deviations obtained from more than five samples. The inset illustrates a cross-sectional schematic of the parallel plate capacitor. FIG. 2E illustrates capacitance measured at various frequencies for the composite gate dielectrics with $BaTiO_3$ volume content of 15% (squares) and 26% (circles), respectively. FIG. 2F illustrates leakage current density of the composite gate dielectric with a thickness of around 2 μm. FIG. 2G illustrates relative change in capacitance ($\Delta C/C_0$) as a function of tensile strain measured from a parallel plate capacitor printed on PDMS. The inset illustrates cross-sectional schematics of the capacitor at relaxed state and stretched state. FIG. 2H illustrates $\Delta C/C_0$ at 0% (circles) and 50% (squares) strains measured during repeated stretching tests for more than 2,000 cycles. FIG. 2I illustrates leakage current density of the composite gate dielectric measured at 0% (red circles) and 60% (blue squares) strains.

FIG. 3A is a plot of the transfer characteristics of devices with 300 nm $SiO_2$. FIG. 3B is a plot of the transfer characteristics of printed $BaTiO_3$/PDMS as gate dielectric. Insets in FIGS. 3A and 3B show the cross sectional schematics of the corresponding devices. FIG. 3C is a plot of representative output characteristics of a TFT with the printed $BaTiO_3$/PDMS hybrid dielectric, of FIG.

3B. FIG. 3D is plot of scattering point statistics of the electrical performance of devices with $BaTiO_3$/PDMS as gate dielectric.

FIGS. 4A-4C illustrate representative electrical characteristics of fully-printed stretchable TFTs on PDMS, in accordance with an example implementation. FIG. 4AA illustrates a semi-logarithmic scale plot showing the forward and backward sweep transfer characteristics ($I_{SD}$-$V_{GS}$) of a TFT measured at $V_{DS}$ of −5 V (red) and −0.5 V (blue), and the gate leakage current curve ($I_{SG}$-$V_{GS}$) measured at $V_{DS}$ of −0.5 V (grey dashed line). FIG. 4BB is a plot of $I_{SD}$ (blue) and transconductance (red) as functions of $V_{GS}$ plotted in linear scale for the same device in panel FIG. 4AA. FIG. 4CC illustrates output characteristics of the same TFT with $V_{GS}$ varying from 30 V to −30 V. the inset shows the $I_{DS}$-$V_{DS}$ curves under low drain bias indicating negligible Schottky barriers at the semiconductor and S/D electrode interfaces.

FIGS. 5A-5H illustrate stretching tests of the printed CNT TFT on PDMS substrate, in accordance with an example implementation. FIGS. 5AA and 5BB are optical micrographs showing two devices stretched along channel length (FIG. 5AA) and channel width (FIG. 5BB) directions, respectively. Scale bars represent 1 mm. FIGS. 5CC and 5FF illustrate transfer characteristics at $V_{DS}$ of −0.5 V while the devices are stretched to various strain levels along the channel length FIG. 5CC and channel width FIG. 5FF directions, respectively.

FIGS. 5DD and 5GG illustrate transfer characteristics at $V_{DS}$ of −0.5 V while the device is stretched to 50% strain for the $1^{st}$ time (red), the $370^{th}$ time (green), the $760^{th}$ time (blue) and the $1400^{th}$ time (orange) along channel length (FIG. 5DD) and channel width (FIG. 5GG) directions, respectively. FIGS. 5EE and 5HH illustrate field-effect mobility (left axes) and on/off current ratio (right axes) as functions of tensile strain (upper panel, in the $1^{st}$ cycle) and stretching cycles (lower panel, at 50% strain) along channel length (FIG. 5EE) and channel width (FIG. 5HH) directions, respectively.

FIGS. 8A and 8C are plots of transfer curves measured at $V_{DS}$ of −0.5 V under 0% (blue) and 50% (red) strains during the 1400th stretching cycle when the device is stretched along channel length (FIG. 8A) and along the channel width C (FIG. 8C) directions, respectively. FIGS. 8B and 8D illustrate plots of field-effect mobility (red circles) and on/off current ratio (blue squares) at 0% strain as a function of stretching cycle when the device is stretched along channel length (FIG. 8B) and along channel width D (FIG. 8D) directions, respectively.

FIG. 9A illustrates optical micrographs of a printed resistive load inverter (i), a resistive load 2-input NOR gate (ii), and a 2-input NAND gate (iii).

DETAILED DESCRIPTION

The present techniques provide intrinsically stretchable thin-film transistors (TFTs) and integrated logic circuits directly printed on elastomeric polydimethylsiloxane (PDMS) substrates. The printed devices utilize carbon nanotubes and a type of hybrid gate dielectric comprising PDMS and barium titanate ($BaTiO_3$) nanoparticles. The $BaTiO_3$/PDMS composite simultaneously provides high dielectric constant, superior stretchability, low leakage, as well as good printability and compatibility with the elastomeric substrate. In example implementations, both TFTs and logic circuits may be stretched beyond 50% strain along either channel length or channel width directions for thousands of cycles while showing no significant degradation in electrical performance. The techniques may be implemented in sophisticated stretchable electronic systems with monolithically integrated sensors, actuators, and displays, fabricated by scalable and low-cost methods.

While various examples herein are described using barium titanate ($BaTiO_3$) nanoparticles, any of the previous techniques may be applied using other nanoparticles with high dielectric constant in place of $BaTiO_3$ such as strontium titanate nanoparticles ($SrTiO_3$), titanate nanoparticles ($TiO_2$), halfnium dioxide ($HfO_2$), zirconium dioxide ($ZrO_2$), tantalum pentoxide ($Ta_2O_5$), etc. Therefore, references herein to $BaTiO_3$ should be considered as including these and other suitable high dielectric constant nanoparticle materials in various examples. As used herein, references to nanoparticles with high dielectric constant refers to nanoparticles with a dielectric constant higher than 20, and preferably higher than 100, and more preferably higher than 200, and extending to at least 7000, and more preferably extending to at least 15,000. For example, $BaTiO_3$ has a dielectric constant of 300 in some examples herein and can have dielectric constants even higher.

Further still, while various examples herein are described using PDMS has an elastomeric substrate, other elastomers can be used instead of PDMS, including silicone, PUA (polyurethaneacrylate), and TPE (thermoplastic elastomer); and thus references herein to PDMS should be construed as including these other elastomers in various examples.

In example implementations, the present techniques demonstrate fully-printed stretchable integrated circuits on PDMS substrates. Unsorted carbon nanotubes (CNTs) and high purity semiconducting single-walled carbon nanotubes (sSWCNTs) are used as the source/drain/gate electrodes and channel semiconductor, respectively. As shown in the schematic of FIG. 1A and the optical micrograph of FIG. 1B, stretchable TFTs were fabricated using an all-printing process adopting a top contact and a top gated device structure.

Figure 1A:
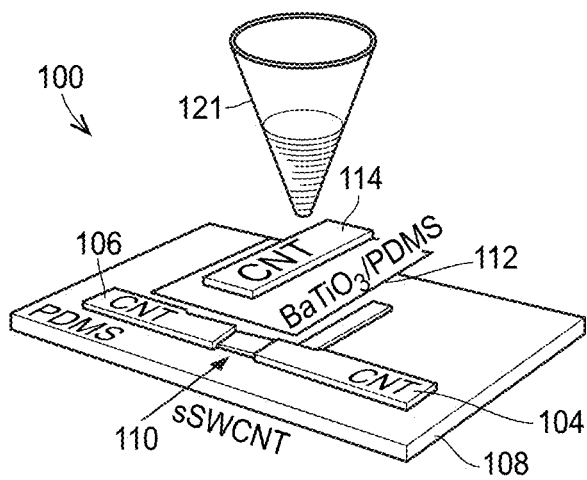
FIGS. 1A-1F illustrate fully-printed and intrinsically stretchable carbon nanotube (CNT) thin-film transistors (TFTs) and integrated logic circuits, in accordance with an example implementation.
Figure 1B:
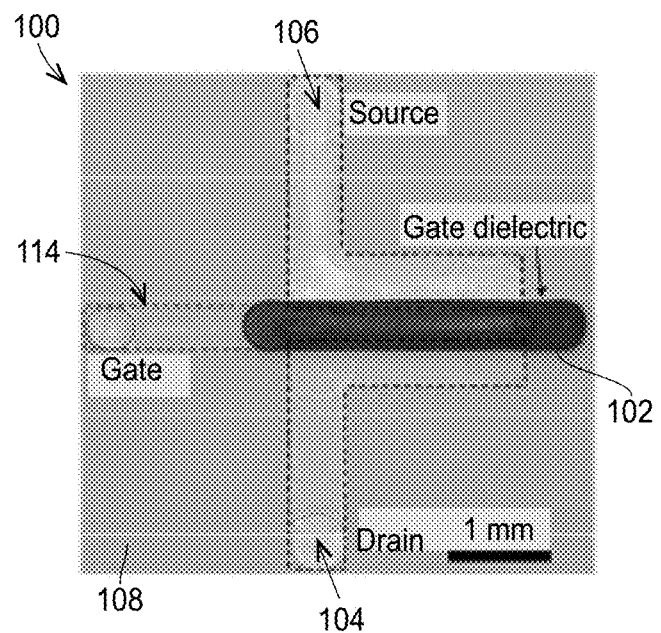

FIGS. 1A and 1B show a thin-film device 100, in the form of a TFT, during a fabrication process. The TFT 100 is formed with a gate 114, a drain 104 and a source 106. The electrodes of the source 106, the drain 104, and the gate 114 are formed of unsorted carbon nanotubes (CNTs) formed on a substrate 108, in accordance with examples herein. The substrate 108 may be a stretchable substrate, for example, formed of PDMS. While examples herein are described with reference to PDMS, it will be appreciated that PDMS is provided by way of example. Any number of other elastomer can be used as substrates, including, by way of example, silicone, PUA (polyurethaneacrylate), TPE (thermal plastic elastomer), etc.

A channel semiconductor region 110 between these electrodes is formed of high purity semiconducting single-walled carbon nanotubes (sSWCNT) formed on the substrate 108. A $BaTiO_3$(Barium titanate)/PDMS (polydimethylsiloxane) composite layer 112 was formed on the substrate 108 and used as gate dielectric 102. That is the gate 114 is formed for a CNT nanotube layer, a portion of the channel semiconductor region 110, and the gate dielectric 102.

Compared with silver or gold nanoparticle inks, the most widely used conducting materials in printed electronics, these CNT electrodes 114, 104, and 106, for example, provide better electrode-semiconductor contacts due to the perfect structural and electronic consistency between carbon nanotubes. In addition, carbon nanotubes allow for stretchable electrodes because of their ultrahigh aspect ratio and the formation of highly deformable mesh structures in macroscale assemblies. An example printing nozzle 121 is shown in the illustrated example.

Figures 1C, 1D, 1E:
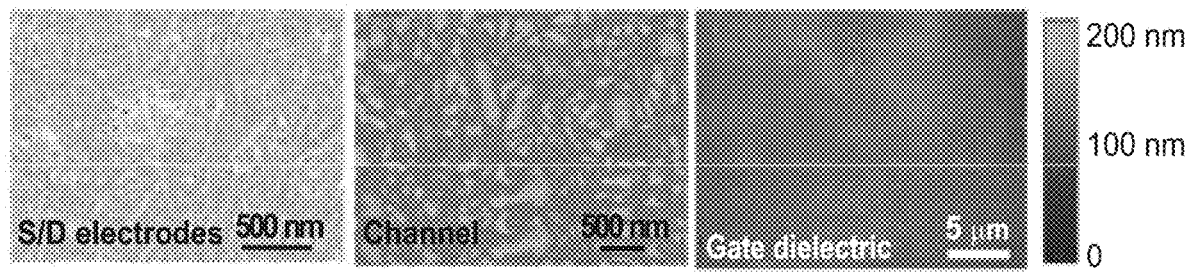
Figure 1F:
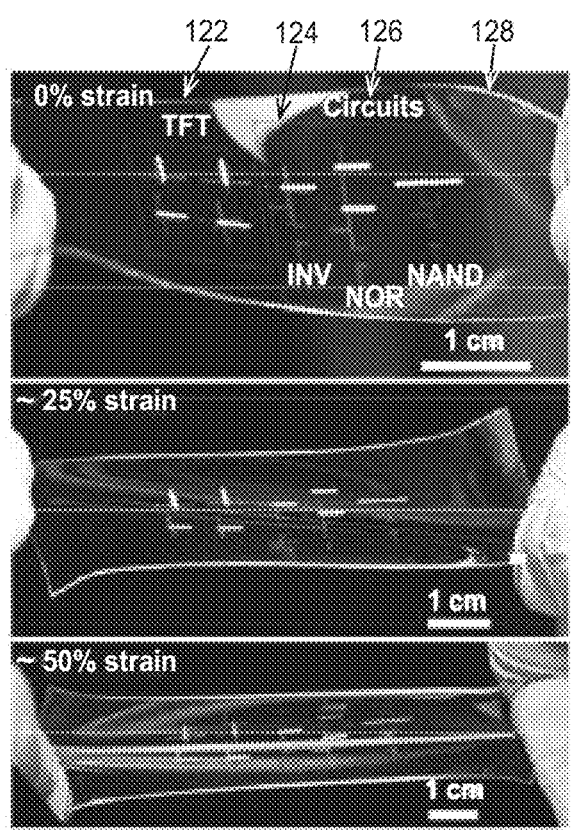
Figure 1G:
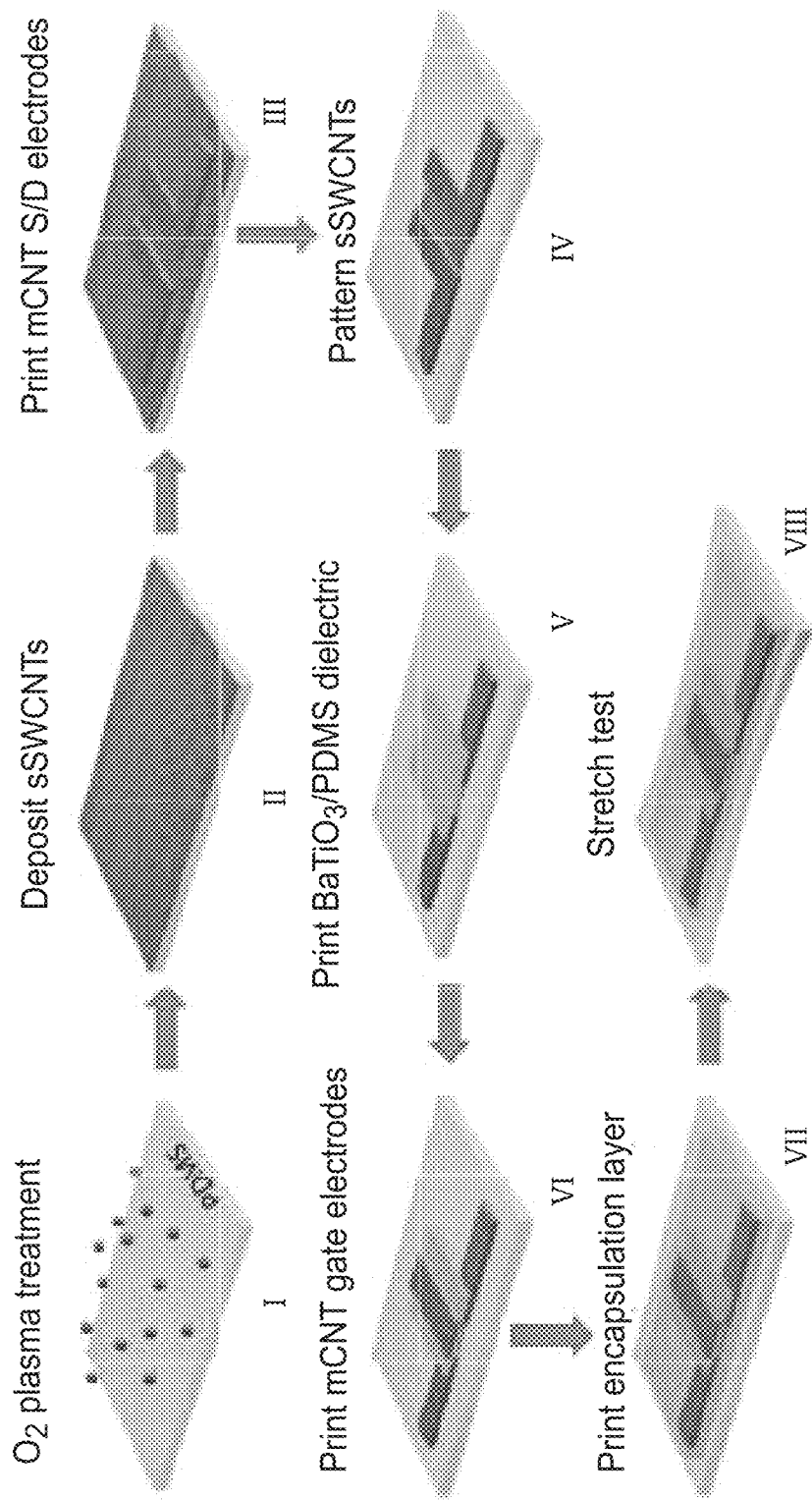
FIG. 1G illustrates an example fabrication process for forming a printable stretchable thin-film device, in accordance with an example implementation.
Figure 1H:
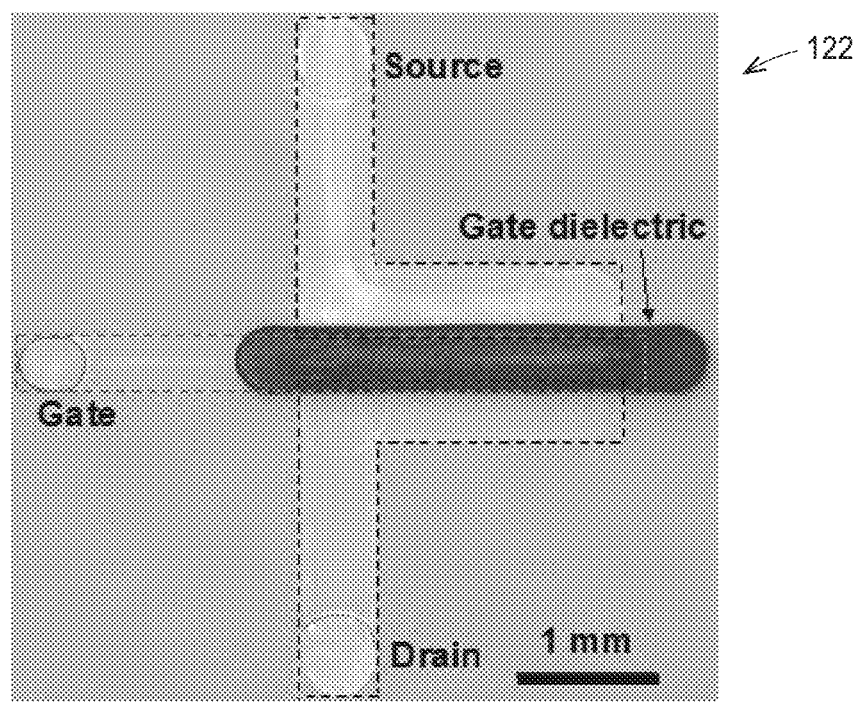
FIG. 1H is an illustration of the printed TFT of FIG. 1F, showing a gate, source and drain formed of unsorted carbon nanotube networks, a gate dielectric formed of $BaTiO_3$/PDMS composite, and a channel (underneath gate dielectric) formed of semiconducting-enriched carbon nanotube network.
Figure 1I:
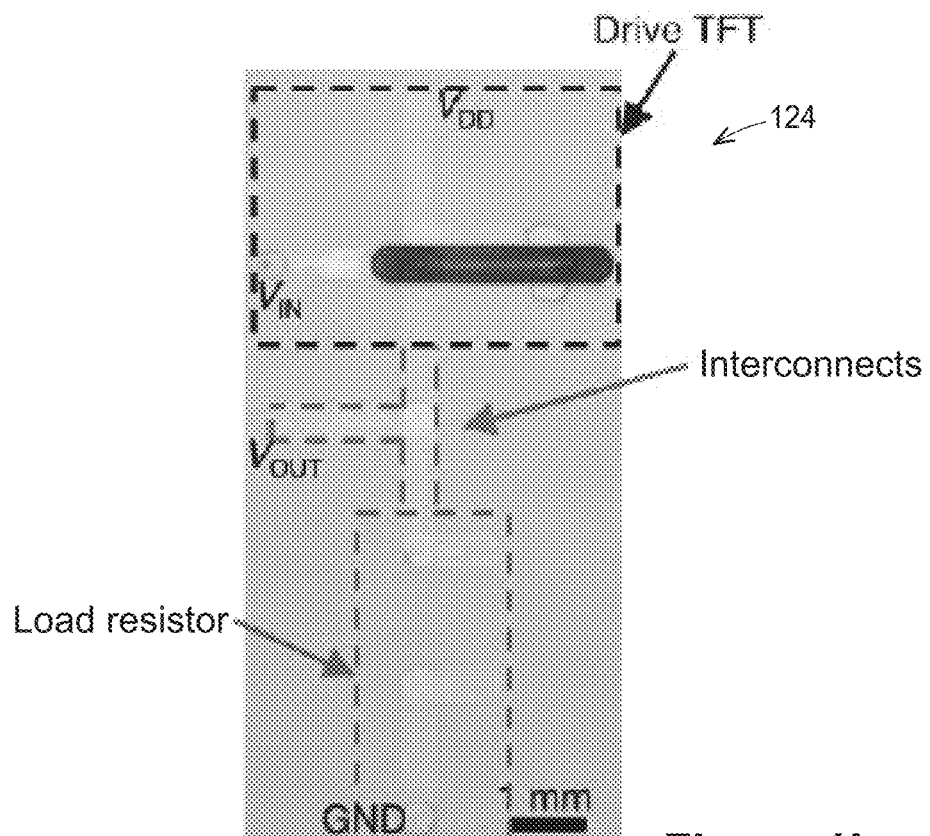
FIG. 1I is an illustration of the printed thin-film inverter of FIG. 1F, showing a driving TFT and a load resistor. The TFT has the same structure in FIG. 1H. The Load resistor is formed of unsorted carbon nanotube network as interconnects and semiconducting-enriched carbon nanotube network in the channel region. The driving TFT and load resistor are connected by interconnects that are formed of unsorted carbon nanotube networks.
Figure 1J:
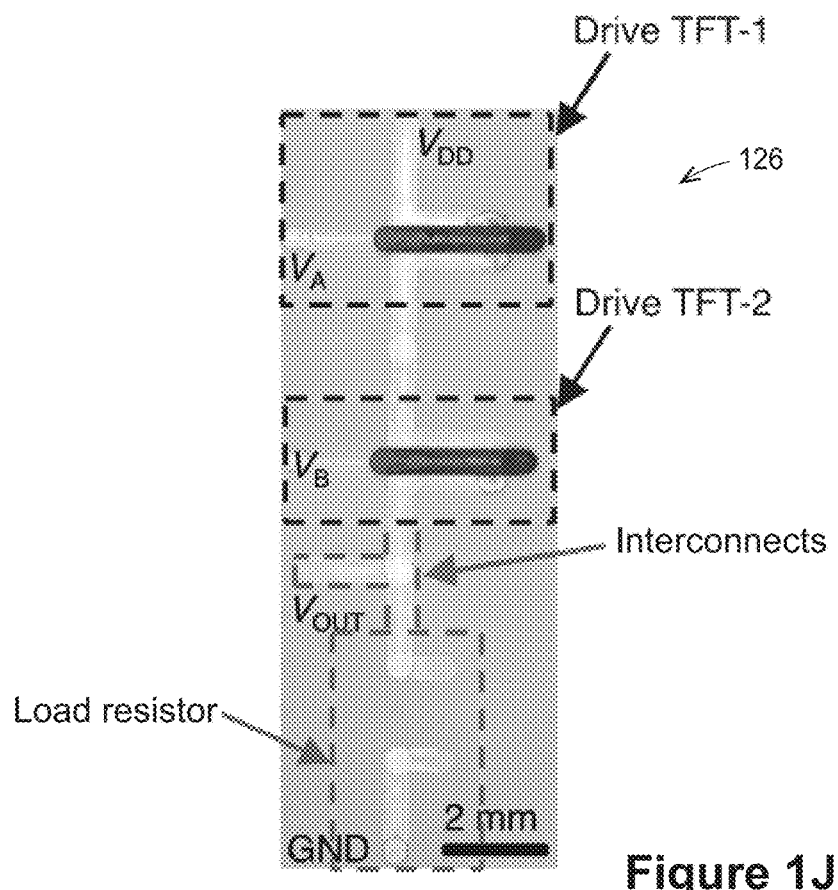
FIG. 1J is an illustration of the printed thin-film NOR gate of FIG. 1F, showing two driving TFTs and a load resistor. The two driving TFTs have the same structure as the TFT in FIG. 1H. The load resistor is formed of unsorted carbon nanotube network as interconnects and semiconducting-enriched carbon nanotube network in the channel region. The two driving TFTs and load resistor are connected in series by interconnects that are formed of unsorted carbon nanotube networks.
Figure 1K:
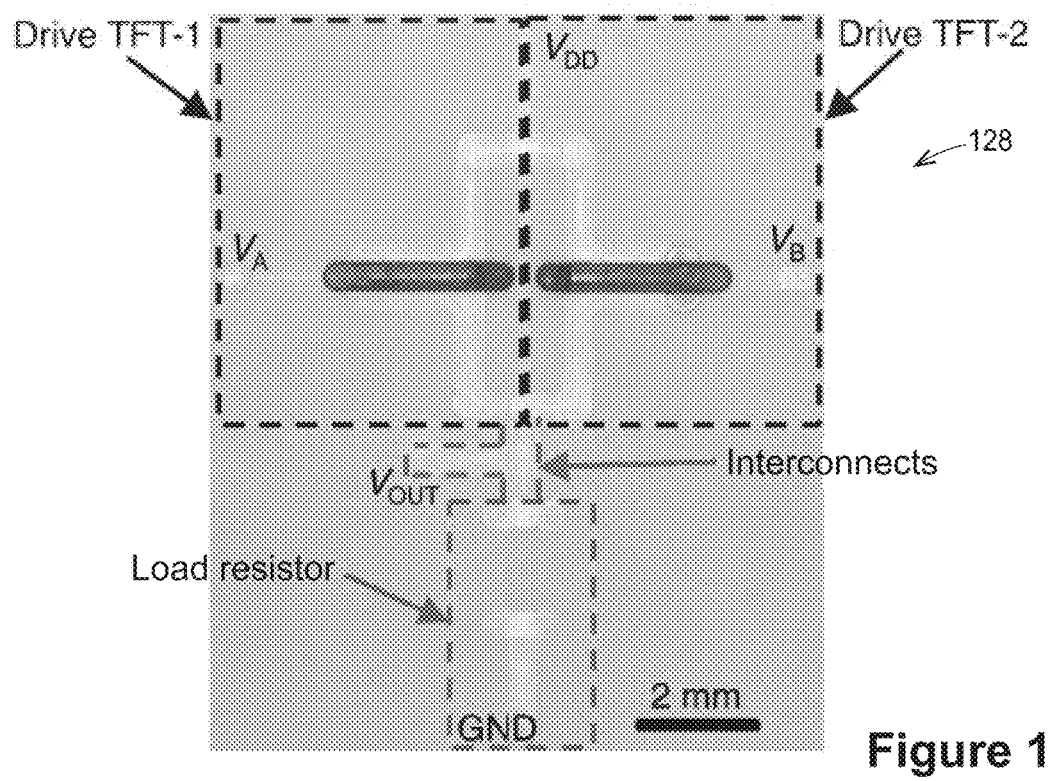
FIG. 1K is an illustration of the printed thin-film NAND gate of FIG. 1F, showing two driving TFTs connected in parallel and a series load resistor. The two driving TFTs have the same structure as the TFT in FIG. 1H. The load resistor is formed of unsorted carbon nanotube network as interconnects and semiconducting-enriched carbon nanotube network in the channel region. The two driving TFTs and load resistor are connected by interconnects that are comprised of unsorted carbon nanotube networks.

FIG. 1G illustrates an example fabrication process flow for forming the printable stretchable thin-film devices like that of device 100 and 120. The fabrication process included:

1. Treat the surface of polydimethylsiloxane (PDMS) substrates (Sylgard 184, 10:1, ~0.5 mm thick) with $O_2$ plasma (30 W, 500 mTorr, 3~5 sec). This step rendered the PDMS surface hydrophilic due to the formation of a very thin layer of silica.
2. Functionalize the treated PDMS surface with amine-group by immersing it in poly-L-lysine (0.1% w/v in water, Sigma-Aldrich) for 10 min followed by rinsing with deionized (DI) water and blowing dry with $N_2$.
3. Semiconducting single-walled carbon nanotubes (sSWCNT) (0.01 mg/ml, 98% semiconducting enriched, NanoIntegris) were deposited onto the functionalized PDMS surface by drop casting for 30 min followed by rinsing with DI water and blowing dry with $N_2$ (illustrated step I).
4. The channels of the TFTs (width ~2500 μm, length ~150 μm) were defined by printing unsorted carbon nanotube (CNT) solution (0.5 mg/ml, with 0.1 mg/ml Triton X-100) for 40~50 (i.e., between approximately 40 to 50) layers as the source and drain electrodes (L shaped electrodes in illustrated step III). The CNT solution is also referred to herein as CNT ink.
5. S1813 (Microchem) photoresist was printed onto the channel as a protective layer. The semiconducting single-walled carbon nanotubes out of the channel region were subsequently etched away by $O_2$ plasma (60 W, 500 mTorr, 1 min) (in illustrated step IV). (Step 5 was skipped for devices with semiconducting carbon nanotubes printed in the channel)
6. $BaTiO_3$/PDMS ink was printed as the gate dielectric followed by curing at 150° C. for 20 min.
7. The surface of the gate dielectric was rendered hydrophilic by $O_2$ plasma treatment (30 W, 500 mTorr, 2 sec) (in illustrated step V).
8. Unsorted carbon nanotube solution (same as step 4) were printed onto the gate dielectric for 20~30 layers as the top gate electrode (in illustrated step VI), followed by depositing an encapsulation layer (in illustrated step VII) and then performing a stretch test on the TFT (in illustrated step VIII).

Steps 1-8 concluded the fabrication of the stretchable TFTs such as the TFT 100. For the integrated logic circuits that were also included in the thin-film device 120, several additional steps were added:

9. More unsorted carbon nanotube solution was printed for 40~50 layers as the interconnection in the logic circuits and to define the channel of load resistor.
10. Carbon nanotubes were printed in the channel of the load resistor layer by layer until an optimal resistance value is achieved.
11. Finally, before stretching tests, PDMS was printed to cover the whole carbon nanotube features as an encapsulation layer to prevent the devices from catastrophic cracking.

In an example, the fabrication steps used for stretchable parallel plate capacitors (see, FIGS. 2A-2I discussed below) were as follows:

1. The PDMS surface was treated with $O_2$ plasma (30 W, 500 mTorr, 3 sec).
2. Unsorted carbon nanotube ink was printed on the treated PDMS as the bottom electrode.
3. $BaTiO_3$/PDMS was printed as dielectric layer followed by curing at 150° C. for 20 min.
4. The device was treated with O2 plasma (30 W, 2 sec) to make the dielectric surface hydrophilic.
5. A second layer of unsorted carbon nanotube was printed on the dielectric as the top electrode.

FIGS. 1C and 1D reveal the dense unsorted CNT network in the source/drain electrodes and the monolayer sSWCNT network in the TFT channel region.

In example implementations, the gate dielectric layer 112 is a composite formed of PDMS, the same material as the stretchable substrate, and $BaTiO_3$ nanoparticles, a ceramic material with a relative permittivity of up to ~200. The result is a hybrid dielectric material that combines the beneficial characteristics of each, i.e. the high permittivity of $BaTiO_3$ and superior stretchability of PDMS. Hence, as shown below, the hybrid dielectric material delivers excellent electrical performance, mechanical robustness, and compatibility with the substrate. An atomic force micrograph (AFM) of the printed $BaTiO_3$/PDMS dielectric is shown in FIG. 1E.

FIG. 1F presents illustrations of a representative device 120 having 4 printed TFTs 122 and integrated logic circuits (an inverter 124, NOR gate 126, and NAND gate 128) in various states of stretch, including a relaxed state (0% strain) and under tensile strain of ~25% or ~50%. These circuits are shown in further detail in FIGS. 1H, 1I, 1J, and 1K, respectively.

In some examples, the unsorted carbon nanotubes used for the electrodes and interconnections may be purified with nitric acid and contain 1.0-3.0 atomic percent carboxylic acid, and thereby can be dispersed well in pure water without the assistance of any surfactant. Experiments show that back-gated TFTs fabricated on Si/SiO$_2$ substrates with printed CNT ink as the source/drain electrodes exhibit comparably high performance as those with thermally evaporated metal electrodes. Printing aqueous inks directly onto PDMS is, however, challenging because the surface of PDMS is extremely hydrophobic. Although it is possible to render PDMS surface hydrophilic by O$_2$ plasma or UV ozone treatments, the material recovers its hydrophobicity quickly, especially under elevated temperatures that are sometimes required for printing processes. By adding a small amount (0.1% wt.) of Triton X-100 to tune the surface tension of the CNT solution, we were able to print carbon nanotubes on PDMS directly with very well-defined and uniform features. Example concentration ranges for Triton X-100 are from 0.01-1%. Since the CNT solution has a quite low concentration (<0.5 mg/ml), multiple printing runs were used to obtain a conductive feature. We note that while the Triton X-100 is a widely used surfactant, we added it here for tuning the surface tension of the ink instead of facilitating the dispersion of carbon nanotubes. Unsorted carbon nanotubes containing for example 1.0-3.0 atomic percent carboxylic acid groups and can be dispersed in pure water directly without any surfactant. In fact, 0.1% Triton X-100 is significantly lower than the concentration needed to disperse CNTs without functional groups. Lastly, because the concentration of Triton X-100 used in our inks is very low, the electrical properties of the CNTs are not affected noticeably. Further still, other surfactants may be used in place of Triton X-100, including, for example, SDS (sodium dodecyl sulfate), SDBS (sodium dodecylbenzenesulfonate), and SDC (sodium deoxycholate). These surfactants exhibit effectiveness is assisting the dispersion of carbon nanotubes.

FIG. 2A presents the resistance of the printed CNT features after various numbers of printing runs, in an example implementation. The resistance drops dramatically during the first ~20 runs and reaches several kΩ after ~40 runs, which is sufficiently low to work as the source/drain electrodes for CNT TFTs (channel resistance is greater than hundreds of kΩ). It has been extensively studied that, due to the one-dimensional attributes of CNTs and the mesh structure of their macroscale assemblies, CNT thin films exhibit excellent stretchability. Additionally, the increase in resistance under tensile strain can be further alleviated by a polymeric encapsulation layer. Comparing the pristine CNT features printed on PDMS with those encapsulated by an additional PDMS layer, one can clearly see that the encapsulated CNT film exhibit better stretchability, with a change in resistance of ~200% under 60% tensile strain (FIG. 2B). The role of PDMS encapsulant in improving the stretchability of the CNT film can be attributed to the greatly mitigated stress concentration in CNT networks by the surrounding cross-linked PDMS molecules, which prevents the occurrence of macroscale cracks that are responsible for more pronounced increase in resistance of the unencapsulated features. After hundreds of stretching cycles with a maximum strain of 60%, in the illustrated example, the resistance of an encapsulated CNT features settles at around 5 times of its original value (FIG. 2C).

One of the challenges in realizing intrinsically stretchable TFTs is the high performance stretchable gate dielectric material that can simultaneously offer high gating strength, good mechanical robustness, and solution processability. Conventional inorganic gate dielectrics like SiO$_2$ and Al$_2$O$_3$ are rigid and brittle, thus not suitable for stretchable devices unless engineered to a wrinkled configuration by sophisticated approaches. In addition, fabrication using these conventional materials usually requires vacuum-based deposition processes (evaporation or atomic layer deposition), which are costly and not suitable for low-cost applications or green manufacturing.

A number of alternative material platforms, like polymeric dielectrics, ion gels, and hybrid dielectrics have been proposed. Solution processed polymeric dielectrics have been widely used for both flexible and stretchable TFTs but most of them exhibit rather low dielectric constants and gating strength, which leads to high operating gate voltages. Ionic gels (block copolymer networks swollen by ionic liquids) have also attracted extensive research interests as stretchable gate dielectric materials due to their gigantic capacitance and superior stretchability. The practical applications of ion gels are, however, greatly hampered by their instability in ambient conditions, difficulties in suppressing gate leakage current, and possible electrochemical reactions at the dielectric/conductor or dielectric/semiconductor interface. In contrast, hybrid dielectrics having inorganic dielectric nanofillers dispersed in polymer matrix show the best overall performance by combining the high permittivity of inorganic dielectrics with the solution processability and mechanical robustness of polymers. A large variety of inorganic high-k dielectric and polymer composites have been explored. For instance, several groups have demonstrated that the BaTiO$_3$/PMMA composites show excellent performance as the gate dielectric for printed flexible CNT TFTs. Despite the progress, almost all studies focus on hybrid dielectrics that are only flexible and cannot survive large tensile deformations.

In comparison to these conventional proposals, the present techniques provide for highly stretchable hybrid gate dielectric material by blending cubic phase BaTiO$_3$ nanoparticles (particle size ~50 nm) and PDMS. In some implementations, 4-Methyl-2-pentanone was chosen as the solvent because it not only dissolves PDMS very well but also has a vapor pressure and surface tension suitable for printing. Any suitable solvent may be used depending the elastomer oligomer being used. The suitability of a solvent-polymer combination is determined by their solubility parameters. When choosing a solvent, a suitable solvent that has a solubility parameter that is close to that of the polymer, preferably as close as possible. For example, 4-methyl-2-pentanone has a solubility parameter of 8.4, which is very close to that of PDMS (9.3).

Systematic electrical characterizations (FIGS. 2D-2I) reveal that the BaTiO$_3$/PDMS hybrid dielectric exhibits superior performance in almost all aspects—dielectric constant, high frequency characteristics, leakage current, and stretchability. In an example fabrication, BaTiO$_3$/PDMS dispersions were prepared with BaTiO$_3$ volume content of up to ~26%, where these dispersions may be coated on various substrates by spin-coating or direct printing. In an example, the volume content of BaTiO$_3$ nanoparticles in the hybrid gate dielectric is calculated using the following equation:

$$f = \frac{m_{BaTiO_3}/\rho_{BaTiO_3}}{m_{BaTiO_3}/\rho_{BaTiO_3} + m_{PDMS}/\rho_{PDMS}}$$

For example, based on the reported density values of BaTiO$_3$ (5.85 g/cm$^3$) and PDMS (0.965 g/cm$^3$), the volume content of BaTiO$_3$ was calculated to be 0.08, 0.148 and 0.258 for composites with weight ratios (PDMS:BaTiO$_3$) of 1:0.5, 1:1, and 1:2, respectively, in an example.

As shown in FIG. 2D, the relative permittivity increases dramatically and reaches ~9 at a BaTiO$_3$ volume content of ~26%. Inks with higher BaTiO$_3$ contents are very difficult to be dispersed evenly. The relative permittivity versus BaTiO$_3$ volume content can be fitted very well by the well-known Lichtenecker's equation that is widely used to describe composite dielectric systems with spherical fillers:

$$\ln(\varepsilon_{cr}) = f\ln(\varepsilon_{fr}) + (1-f)\ln(\varepsilon_{mr}) \quad (1)$$

where $\varepsilon_{cr}$, $\varepsilon_{fr}$, $\varepsilon_{mr}$ are the relative permittivities of the composite, nanofiller and polymer matrix, respectively, and f is the volume content of the nanofiller. The fitting parameters obtained here, $\varepsilon_{fr}$~307.9, $\varepsilon_{mr}$~2.6, are close to the relative permittivity of cubic phase BaTiO$_3$ and PDMS, respectively. The results here imply that hybridization is an effective approach to greatly enhance the dielectric constant of polymers while maintaining their desirable mechanical property and solution processibility.

The gigantic capacitance in ionic gel dielectric originates from the establishment of electrical double layers, which relies on the migration of mobile ions in an electric field and is very slow. In contrast, the BaTiO$_3$/PDMS composite of the present techniques only undergoes dielectric polarization when placed in an electric field and thus exhibits significantly better high frequency performance. FIG. 2E shows the capacitance-frequency characteristics of parallel plate capacitors made with the BaTiO$_3$/PDMS dielectrics with ~15% or ~26% vol. BaTiO$_3$. As expected, the capacitance is virtually independent of frequency in the range of 100 Hz-1 MHz.

We also characterized the leakage current density of our BaTiO$_3$/PDMS hybrid dielectric using the parallel plate capacitor with a dielectric layer thickness of ~2 µm. As shown in FIG. 2F, regardless of the volume content of BaTiO$_3$, the leakage current density remains below 10 nA/cm$^2$ under a voltage of 200 V (electric field of ~1 MV/cm). For a TFT with a channel footprint of 2000×200 µm, such leakage current density corresponds to a gate leakage current of ~40 pA. The extremely low leakage current implies that the BaTiO$_3$ nanoparticles have very good compatibility with the PDMS matrix and the dielectric layer is free of pinholes.

One of the advantages of hybrid dielectrics is that they inherit the mechanical properties of polymers, which is manifested by the stretching tests on the parallel plate capacitors fabricated on PDMS substrates. Unsorted carbon nanotubes were printed as the top and bottom electrodes of the capacitors, as described above.

Figure 2I:
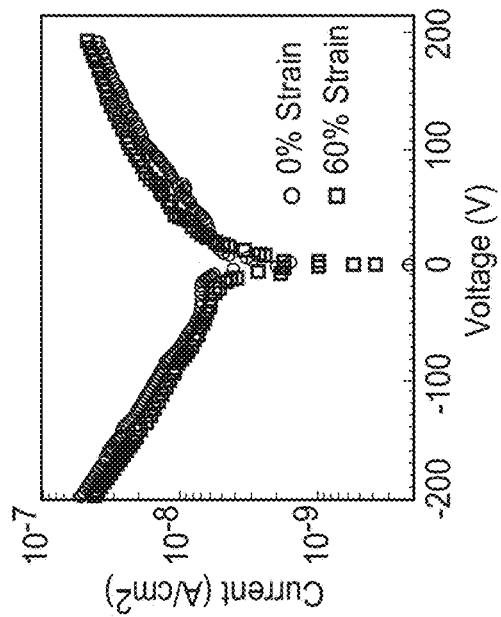
Figure 2H:
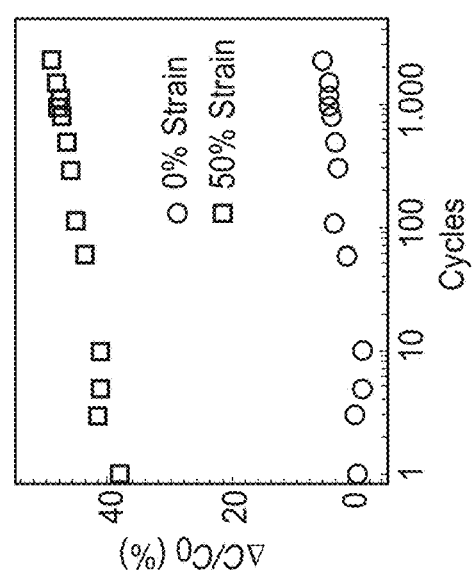
Figure 2G:
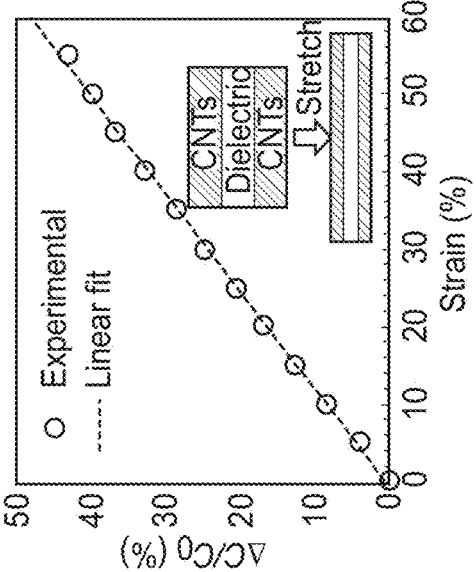

The inset of FIG. 2G illustrates the device structure and its geometric variations under tensile strains. When the capacitor is subjected to tensile strain, it will extend along the stretching direction (l direction) and shrink along the other two perpendicular directions (w and t directions) due to the Poisson effect. The capacitance at zero strain and under tensile stretch can be written as $$C_0 = \varepsilon_{zero}\frac{l_0 \cdot w_0}{t_0} \text{ and } C = \varepsilon\frac{\lambda_1 l_0 \cdot \lambda_2 w_0}{\lambda_3 t_0},$$

respectively, where $\varepsilon_{zero}$ represents the permittivity of the dielectric at zero strain and $\varepsilon$ is the permittivity under strain. Here, the extending ratio along the stretching direction, $\lambda_1$, equals to 1+$\epsilon$, where $\epsilon$ is the tensile strain. For an isotropic material like PDMS, the compression ratios along the other two directions, $\lambda_2$ and $\lambda_3$ should have the same value. Given that the permittivity is independent of tensile strains, the capacitance under tensile strain can be written as C=(1+$\epsilon$)C$_0$, so that the relative change in capacitance is $\Delta C/C_0 = \epsilon$. In other words, the relative change in capacitance is linear to the tensile strain with a slope of 1. The experimental data of $\Delta C/C_0$ versus tensile strains for a parallel plate capacitor using BaTiO$_3$/PDMS dielectric (FIG. 2G) can be fitted very well by a linear function with a slope of ~0.8. The deviation from the theoretical slope of 1 could be explained by the possible anisotropy induced by the presence of BaTiO$_3$ nanoparticles in PDMS. In addition, the permittivity of the composites might be slightly dependent on tensile strains. The increase in capacitance upon stretching leads to a stronger gating strength and thus may benefit the performance of the stretchable CNT TFTs.

Cyclic stretching tests were performed to study the durability of the BaTiO$_3$/PDMS composite dielectric. FIG. 2H presents the $\Delta C/C_0$ (C$_0$ represents the pristine capacitance) of a device repeatedly stretched between 0% and 50% strains for 2,000 cycles. The $\Delta C/C_0$ at 0% and 50% strain both show very slight increasing trend with roughly the same rate over the entire stretching test, which is different from the capacitors with pure silicone dielectric.

We also monitored the change in leakage current during the stretching tests as shown in FIG. 2I. It is impressive that the leakage current showed virtually no change when the device is stretched to 60% strain, implying the superior robustness of the BaTiO$_3$/PDMS dielectric and no formation of pinhole or crack during the stretching process. An additional advantage of the BaTiO$_3$/PDMS hybrid gate dielectric is its excellent compatibility with the PDMS substrate, as manifested by the fact that no sliding between the dielectric and PDMS substrate was observed at a tensile strain up to 100%, which is significantly better than ionic gels.

Figure 3A:
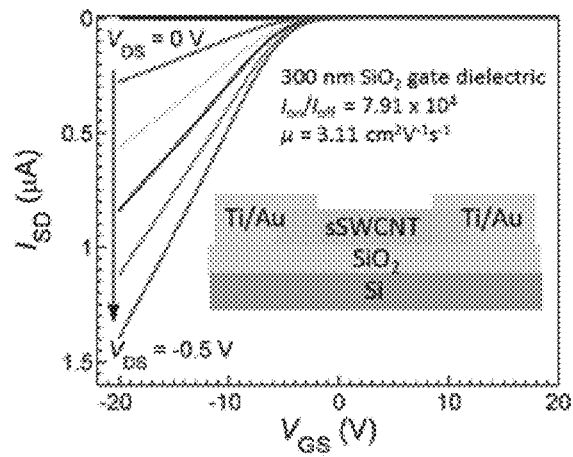
FIGS. 3A-3D illustrate representative electrical characteristics comparing top-gated TFTs on silicon substrate with $BaTiO_3$/PDMS as the gate dielectric, in accordance with an example implementation.
Figure 3B:
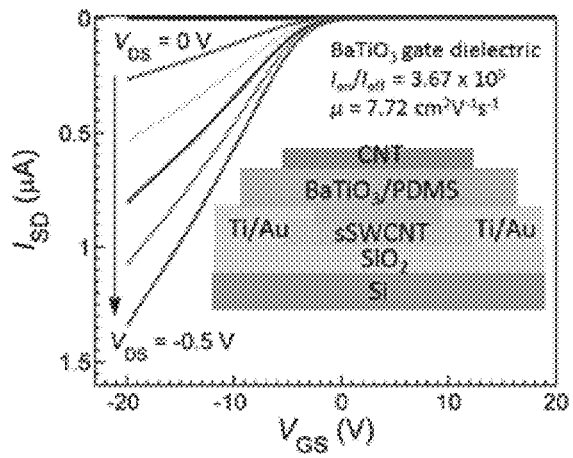
Figure 3C:
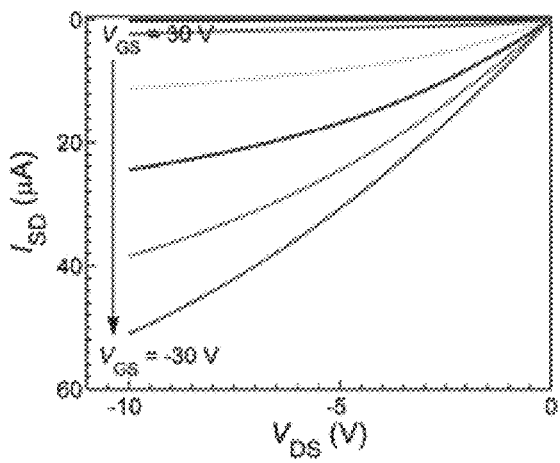
Figure 3D:
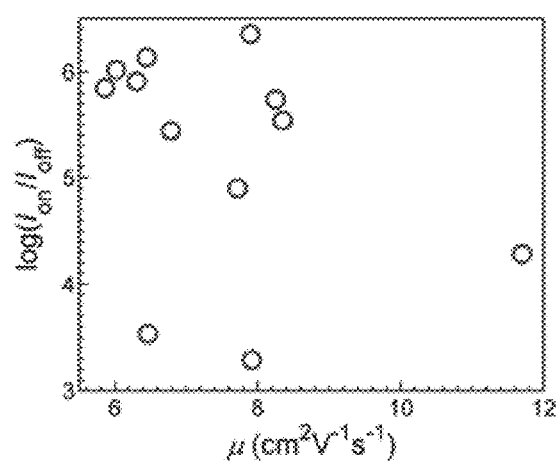

Further, to confirm that the BaTiO$_3$/PDMS works well as a gate dielectric for CNT TFTs, top gated TFTs with evaporated gold source/drain electrodes and printed BaTiO$_3$/PDMS dielectric and CNT gate electrode were assembled on silicon substrates. The results indicate that the printed BaTiO$_3$/PDMS hybrid dielectric outperforms 300-nm-thick high quality thermally-grown SiO$_2$ dielectric by providing TFTs with better field-effect mobility and on/off current ratio. For example, in a demonstration, before fabricating stretchable TFTs on PDMS, we first printed BaTiO$_3$/PDMS hybrid dielectric on TFTs with evaporated Ti/Au source/drain electrodes on Si substrates to confirm that the composite can be used as gate dielectric for CNT TFTs. Comparing FIGS. 3A and 3B, one can find the device with one layer of printed BaTiO$_3$/PDMS gate dielectric considerably outperforms the device with 300 nm SiO$_2$ as dielectric in terms of field-effect mobility (7.72 cm$^2$V$^{-1}$s$^{-1}$ of FIG. 3B vs. 3.11 cm$^2$V$^{-1}$s$^{-1}$) and on/off current ratio (3.67×10$^5$ vs. 7.91×10$^4$). In addition, the representative output characteristics of the top-gated TFTs with printed hybrid dielectric (shown in FIG. 3C) show typical MOSFET-like behavior. In this example, we measured a number of such devices and summarized the results in FIG. 3D. The scattered data points indicate that the TFTs on silicon substrate with printed BaTiO$_3$/PDMS as gate dielectric usually exhibit field-effect mobility of around 7 cm$^2$V$^{-1}$s$^{-1}$ and on/off ratio above 10$^5$. The above results suggest the BaTiO$_3$/PDMS composite indeed works well as gate dielectric for CNT TFTs.

Based on the stretchable CNT electrodes and BaTiO$_3$/PDMS hybrid gate dielectric developed above, stretchable TFTs were successfully fabricated on PDMS substrates by an all-printing process. Such printed TFTs typically have a channel length (L) and channel width (W) of ~150-200 μm and ~2500 μm, respectively. FIGS. 4A-4C present the representative transfer ($I_{SD}$-$V_{GS}$) and output ($I_{SD}$-$V_{DS}$) characteristics of the stretchable TFTs. The transfer curves presented in FIG. 4A show good overlap between the forward and backward sweeps, indicating that hysteresis is nearly absent in our devices. Besides, according to the grey dashed line in FIG. 4A, the gate leakage current remains at a reasonably low level (~100 pA for $V_{GS}$=30 V), which is in good agreement with the values measured from parallel-plate capacitors in FIG. 2I. Linear scale transfer curve and tranconductance ($g_m$) versus $V_{GS}$ of the same device are shown in FIG. 4B. The output characteristics presented in FIG. 4C show unambiguous saturation behavior at high drain voltages that is typical for field-effect transistors and excellent linearity at low bias regime (FIG. 4C inset), indicating negligible Schottky barrier at the interfaces between the channel semiconductor and source/drain electrodes. Most of our devices exhibit field effect mobility around 4 cm$^2$V$^{-1}$s$^{-1}$ and on/off ratio greater than 500 with maximum values of 7 cm$^2$V$^{-1}$s$^{-1}$ and 3000, respectively, which is respectable for the all-printing process.

We additionally investigated the electromechanical properties of the CNT TFTs printed on PDMS by performing systematic stretching tests along both channel length and channel width directions. The optical micrographs in FIGS. 5A and 5B reveal the geometric variations of two devices being stretched along L and W directions, respectively. When the device is stretched along L direction, the channel length elongates and channel width decreases (due to Poisson effect), while the opposite changes (W increases, L decreases) will take place under tensile strain along W direction. The geometric variations are also reflected by the dimensional changes of the source/drain and gate electrodes, whose boundaries are marked by dashed lines. The geometric changes in the channel, as shown below, will have an effect on the TFT characteristics.

Figure 5C:
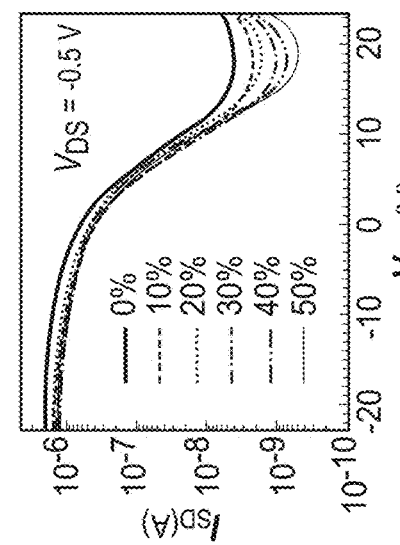
Figure 5D:
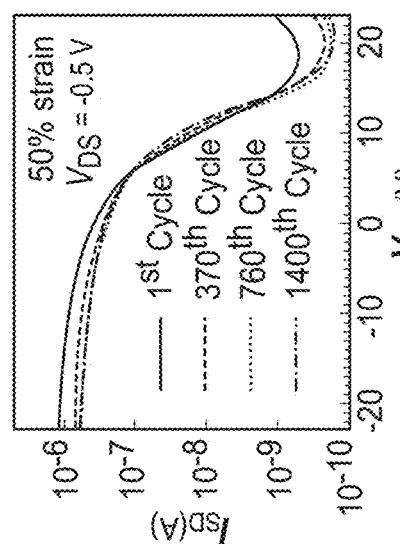
Figure 5E:
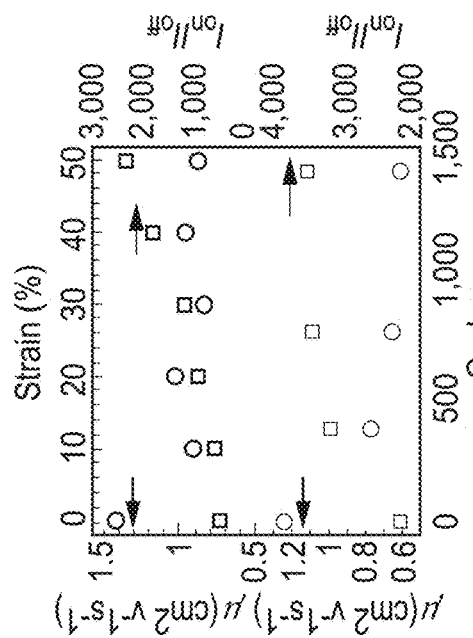
Figure 5F:
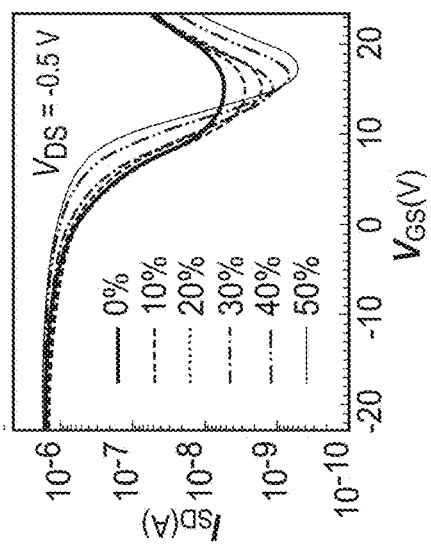

FIGS. 5C and 5F present the evolution of transfer curves at $V_{DS}$ of −0.5 V while the device is stretched up to 50% strain along the channel length and channel width directions, respectively. The on-state current drops by about one half of its pristine value at 50% tensile strain along L direction, while very small decrease is observed under the same strain along W direction. Meanwhile, the off-state current is drastically suppressed for both cases.

Figure 5G:
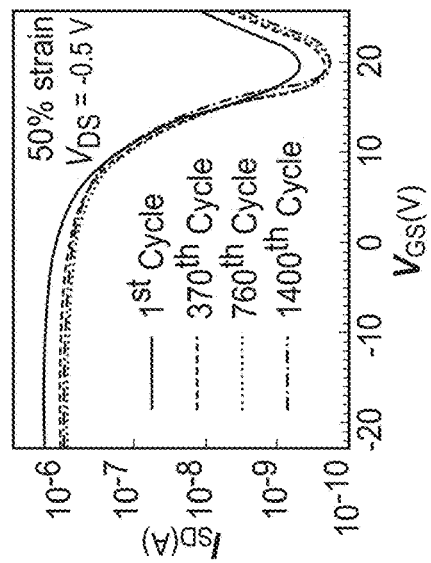
Figure 5H:
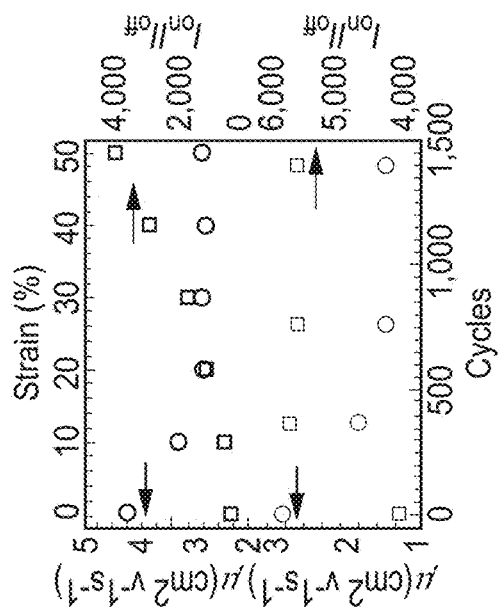

The effects of tensile strain on the TFT drain current ($I_{DS}$) can be interpreted by three primary factors, namely the geometric change of the channel, the initiation and propagation of cracks in the sSWCNT network, and the enhancement in gating strength due to thinner gate dielectric. First, assuming the sSWCNT network and gating strength do not change, $I_{DS}$ is proportional to the ratio of channel width to channel length (W/L), so $I_{DS}$ would decrease when stretched along L direction and increase when stretched along W direction. Second, it is known that the surface of the PDMS will be covered by a very thin layer of silica after O$_2$ plasma treatment; and that is a step for the printing process. The silica skin is extremely brittle and hence forms ubiquitous cracks when the PDMS substrate is subjected to tensile strain. Consequently, many cracks appear in the otherwise continuous sSWCNT network following the deformation of the silica skin. As a result, many percolating pathways are cut off, leading to a reduction in $I_{DS}$. Considering both the influence of geometric change of the channel and the structural change of the sSWCNT network, one can easily understand the distinct behaviors of on-state current when stretched along different directions. It is worth mentioning that the formation of cracks in the channel has a larger influence on the metallic percolation pathways than on the semiconducting ones because the sSWCNT ink used here contains only 2% metallic nanotubes, which is beneficial for the improvement of on/off current ratio under tensile strain. Also, the BaTiO$_3$/PDMS dielectric layer will also become thinner under tensile strain (see FIG. 2G), which contributes to a stronger gating strength and consequently further suppression of the off-state current. The upper panels of FIGS. 5E and 5H present the device field-effect mobility (left axis) and on/off current ratio (right axis) as functions of tensile strains along L direction and W direction, respectively. Device mobility (μ) is extracted using the equation in linear region μ=$g_m$L/(W$V_{DS}C_{ox}$), where $g_m$ and $C_{ox}$ are transconductance and gate capacitance, respectively. Gate capacitance is determined by direct capacitance-voltage (C-V) measurements on the TFTs and considering the geometric changes of the channel. Regardless of stretching direction, mobility decreases by about ⅓ of its original value under 50% strain, reflecting the microscopic structural changes in the sSWCNT networks discussed above. On the other hand, the on/off ratio increases by almost one order of magnitude due to the significantly suppressed off-state current.

Figure 6B:
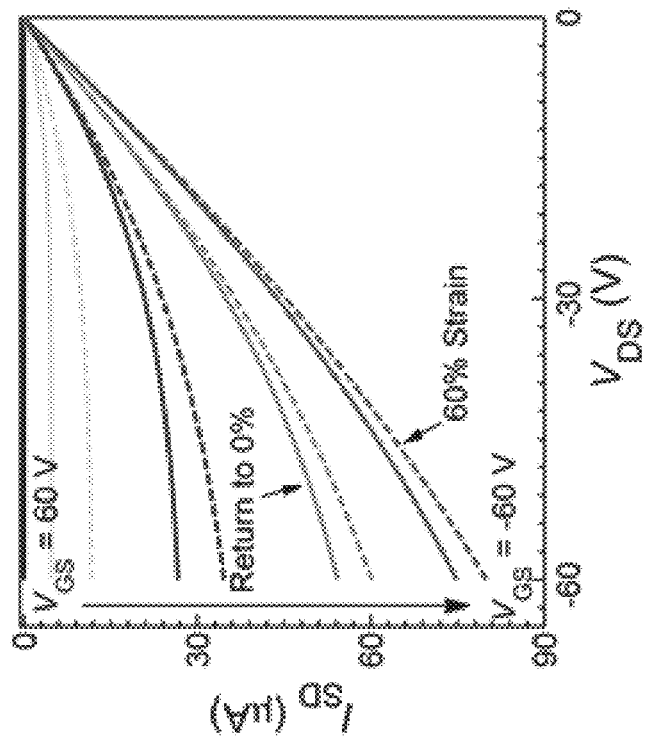
FIGS. 6A and 6B are plots of output characteristics of a fully-printed stretchable CNT TFT at pristine state (0% strain) in FIG. 6A and after being stretched to 60% strain (dashed lines) and after returning to 0% strain (solid lines) in FIG. 6B, in accordance with an example implementation.
Figure 6A:
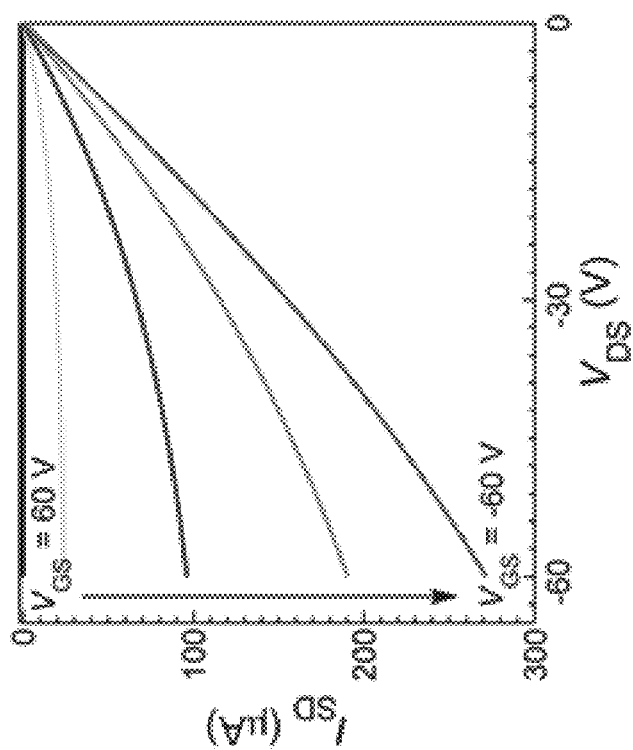

FIGS. 6A and 6B presents the output characteristics of another example device being stretched along the channel length direction (L). The current level drops to about ⅓ of the pristine value after being stretched to 60% strain for the first time and remains nearly unchanged afterwards when the tensile strain is released. Representative output characteristics of the fully-printed stretchable TFTs under tensile strains are shown in FIG. 6A. By comparing FIGS. 6A and 6B, we demonstrate that the current level drops to about ⅓ of the pristine value after the initial stretch to ~60% strain, in this example. After that, the current level settles and remains nearly unchanged after the tensile strain is released (FIG. 6B). Regardless of the tensile strain, the device maintains very standard MOSFET characteristics with clear saturation regions in the output curves. In some implementations, the maximum tensile strain a device can withstand exceeds 50% and is limited only by the rupture of PDMS substrates. In some implementations, devices may be stretched to 100% strain with electromechanical behaviors similar to those described above.

Figure 7B:
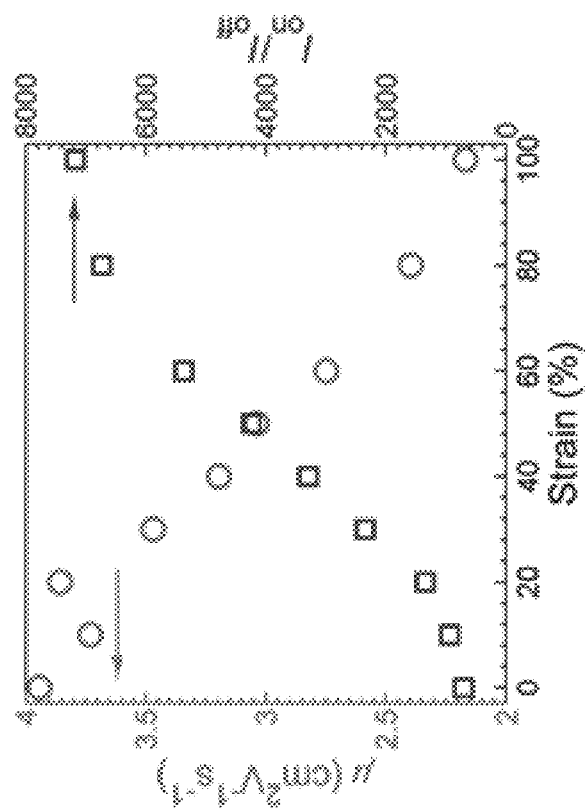
FIG. 7B illustrates field-effect mobility and on/off current ratio as functions of tensile strain, in accordance with an example.
Figure 7A:
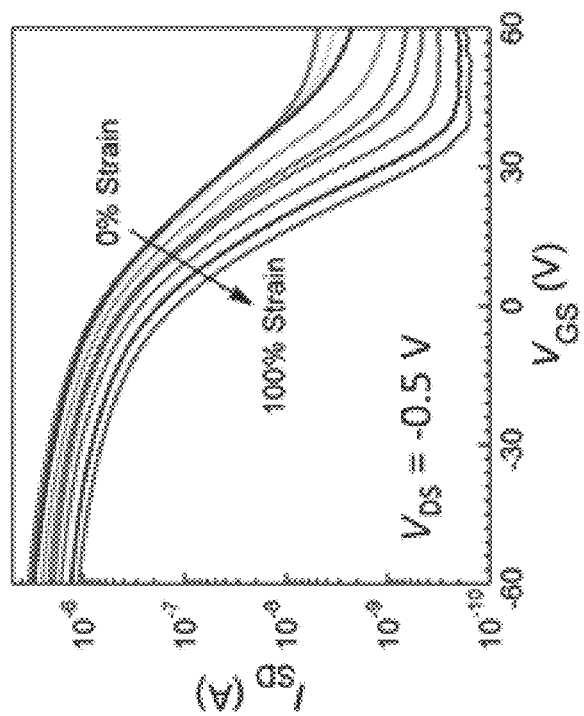
FIG. 7A is a plot of electrical characteristics of a stretchable TFT when being stretched to 100% strain along the channel length direction, in accordance with an example.
Figure 8A:
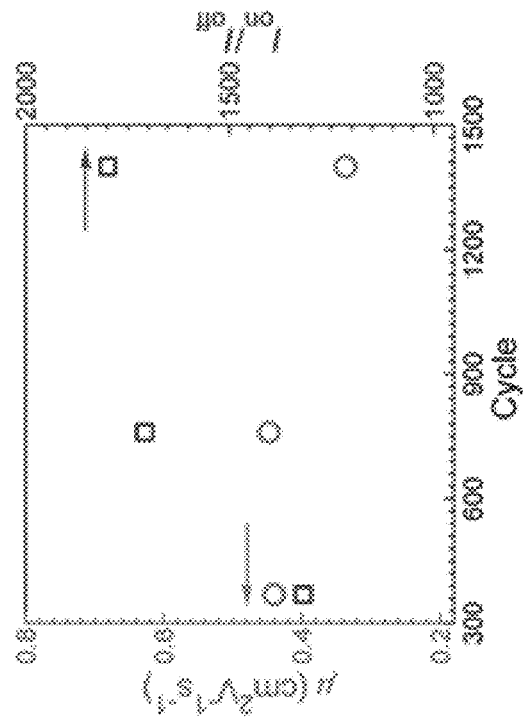
FIGS. 8A-8C present plots of stretching tests data conducted on the thin-film devices examined in FIGS. 5A-5H.
Figure 8B:
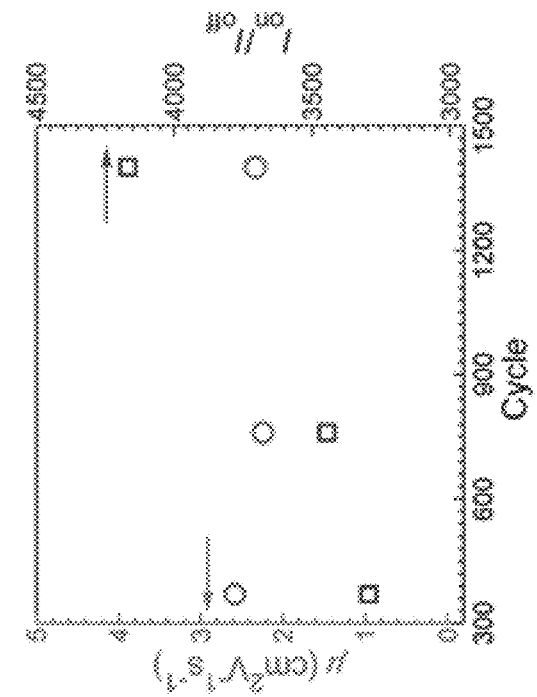
Figure 8C:
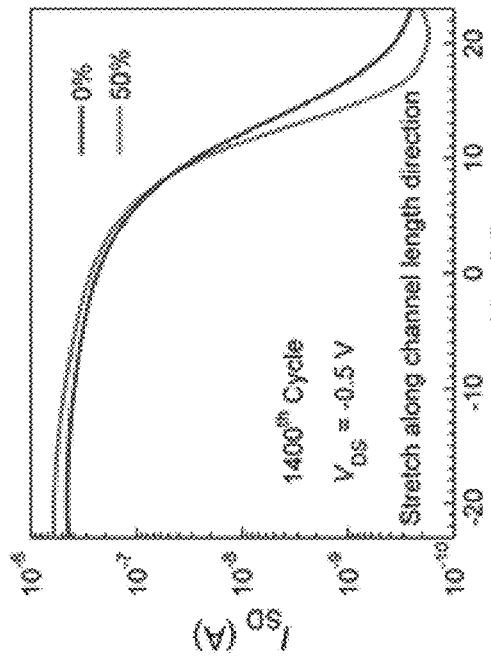
Figure 8D:
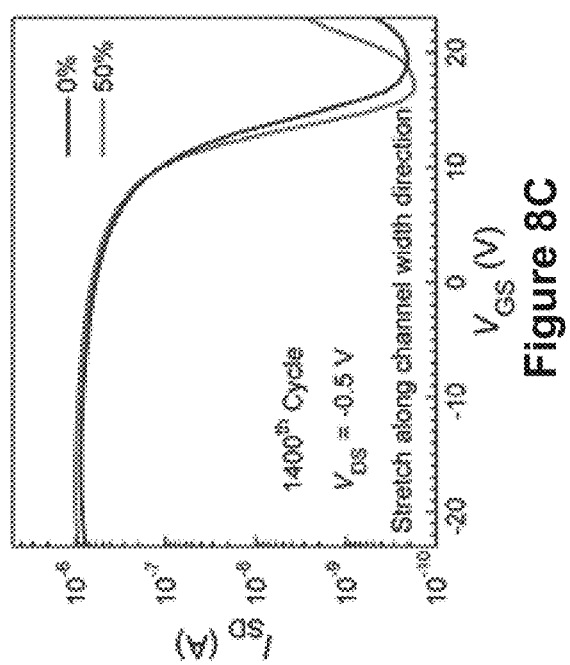

In some examples, the maximum tensile strain thin-film devices can withstand may be limited by the stretchability of the PDMS substrates. Certain devices remain working properly under strains that are significantly higher than 50% as long as the PDMS substrate does not rupture. FIG. 7A presents the electrical characteristics of an example thin-film device when being stretched up to 100% strain along the channel length direction. As expected, the drain current (IDS) does drop due to the geometric changes of the channel and the cracks induced in the sSWCNT network. Nevertheless, the off-state current shows a much more pronounced decrease than the on-state current does because of the low content of metallic carbon nanotubes (only 2%) in the channel and the enhanced gating strength caused by thinner gate dielectric under strain (more detailed discussion can be found in the main text). As a result, the on/off current ratio increases to almost $10^4$ at 100% strain (FIG. 7B). In the meantime, the field-effect mobility drops to roughly half of the pristine value, which is well acceptable considering the high tensile strain.

The stretchable CNT TFTs were then subjected to long-term cyclic stretching with a maximum strain of 50%. The transfer characteristics at 50% strain after different numbers of cycles are shown in FIG. 5D (stretching along L direction) and FIG. 5G (stretching along W direction). The device field-effect mobility (left axis) and on/off current ratio (right axis) at 50% strain are plotted as functions of stretching cycles in the lower panels of FIGS. 5E and 5H for stretching along L and W directions, respectively. Upon repeated stretching, the on-state current, off-state current and mobility drop further while on/off current ratio keeps increasing, which could be attributed to further expansion of the cracks and probable initiation of new cracks in the sSWCNT networks. All device performance metrics start to stabilize after hundreds of stretching cycles.

FIGS. 8A-8D presents the transfer curves measured at $V_{DS}$ of −0.5 V under 0% and 50% strains at the $1400^{th}$ stretching cycle for the same devices. Overall, the difference between the transfer curves at 0% and 50% strains is practically negligible for both devices, indicating the TFTs are stabilized and show almost strain-independent electrical performance after more than 1000 stretching cycles.

The above results of stretching tests reveal that our printed CNT TFTs exhibit excellent mechanical robustness and can maintain very stable electrical performance under harsh conditions often encountered in real life wearable electronics applications.

Figure 9A:
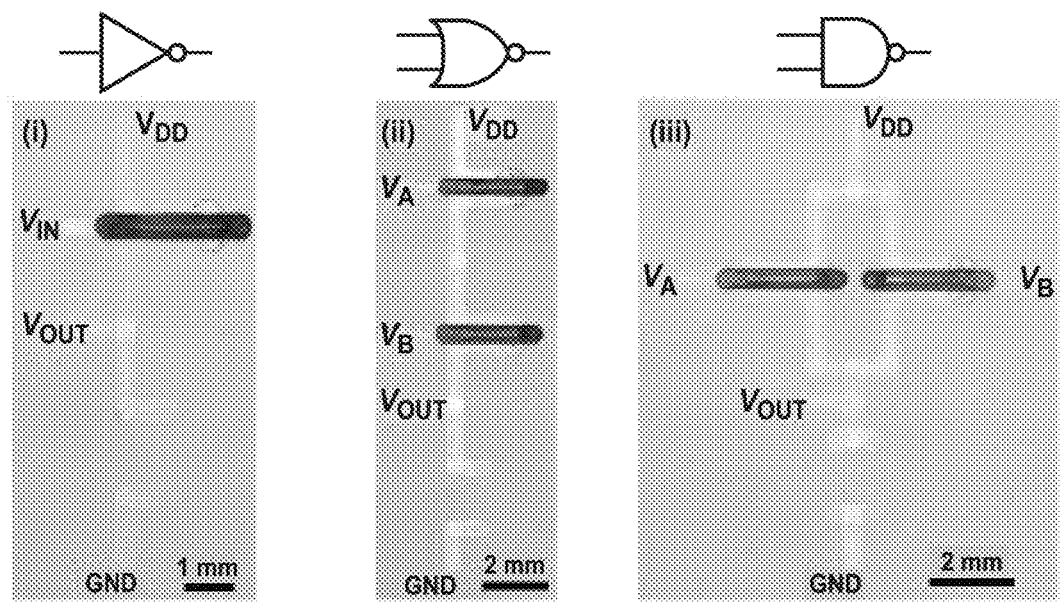
FIG. 9A illustrates fully-printed stretchable integrated logic circuits on PDMS, in accordance with example implementations.
Figure 9B:
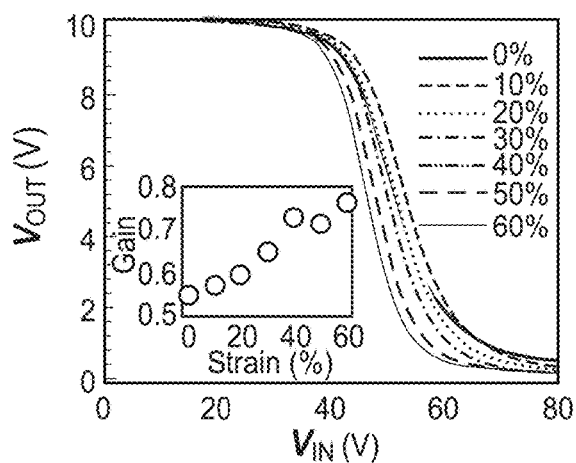
FIG. 9B illustrates inverter voltage transfer characteristics (VTCs) measured with a $V_{DD}$ of 10 V while the device is stretched to various strain levels along the channel length direction of the driving TFT. The inset shows the inverter gain as a function of tensile strain.
Figure 9C:
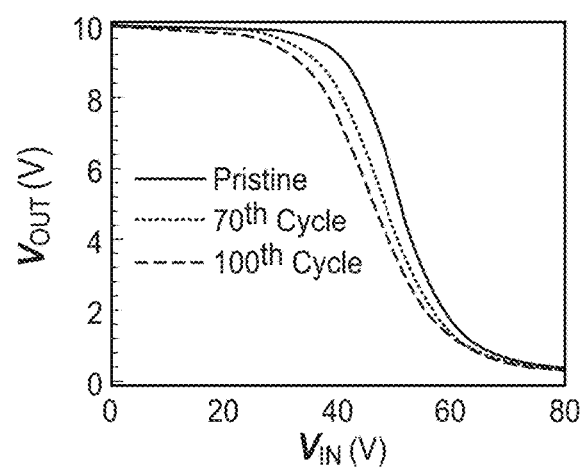
FIG. 9C illustrates inverter VTCs measured at a $V_{DD}$ of 10 V while the device is at pristine state (0% strain, red), and at 0% strain after 70 (blue) and 100 (green) stretching cycles with a maximum strain of 50% along the channel length direction of the driving TFT.

The present techniques also include fully-printed stretchable integrated logic circuits on PDMS, including an inverter and NOR and NAND gates. FIG. 9A shows the optical micrographs of a resistive load p-type inverter (left), a resistive load 2-input NOR gate (middle) and a 2-input NAND gate (right). After fabricating the driving TET, unsorted CNTs were printed in the load resistor layer by layer until an optimal performance was achieved. Systematic electrical and electromechanical characterizations were conducted on the stretchable logic circuits. FIG. 9B presents the inverter voltage transfer characteristics (VTCs) with a $V_{DD}$ of 10 V under various strains along the channel length direction of the driving TFT. The inverter exhibits more pronounced rail-to-rail output voltage swing as the tensile strain is increased to 60%, owing to the improved on/off ratio of driving TFT. In addition, repeated stretching tests indicate that the stretchable inverter exhibits very stable performance, as shown in FIG. 9C.

The output voltage of a resistive load inverter is determined by the voltage division between the channel resistance ($R_{Channel}$) of the driving TFT and the load resistance ($R_{Load}$) and can be expressed as $$V_{OUT} = V_{DD} \cdot R_{Load}/(R_{channel} + R_{Load}). \quad (2)$$

When the TFT is turned on (low $V_{IN}$ for a p-type TFT), $R_{Load}$ is significantly higher than $R_{Channel}$, hence $V_{OUT}$ is approximately equal to $V_{DD}$; similarly, $V_{OUT}$ is close to 0 when the TFT is turned off (high $V_{IN}$ for a p-type TFT) because $R_{Channel}$ is much greater than $R_{Load}$. From Eq. (2) and considering the evolution of transfer characteristics of the driving TFT discussed in FIGS. 5A-5H, one can understand the dependence of inverter VTCs on tensile strains in FIG. 9B. Of further relevance, FIGS. 10A-10D present the dependence of $R_{Load}$ and $R_{Channel}$ on tensile strains. The inverter voltage transfer characteristics (VTCs) are determined by the voltage division between the channel resistance of the driving TFT ($R_{Channel}$) and the load resistance ($R_{Load}$). We measured the load resistance at various tensile strains and the results are presented in FIG. 10A. The transfer curves of the driving TFT at a VDS of 5 V under various tensile strains were then converted to $R_{Channel}$ plotted as a functions of VGS as shown FIG. 10B.

The off-state channel resistance of the driving TFT increases by more than an order in magnitude when stretched to 60% strain, which is in agreement with the previous results that the TFT off-state current is significantly suppressed under strains (FIG. 5C). Using Eq. (2) and the values of $R_{Load}$ and $R_{Channel}$ shown in FIGS. 10A and 10B, inverter VTCs under various strain levels are calculated (FIG. 10C) and the calculated VTCs reproduce the experimental results very well. Based on the analysis here and considering the load resistance and channel resistance increase with tensile strains at roughly the same rate, one can easily understand why the inverter characteristics only show minor changes while being stretched to up 60% strain. Additionally, the inverter VTCs at 50% strain during various stretching cycles are presented in FIG. 10D, indicating excellent durability of the inverter during cyclic stretching tests.

Figure 9D:
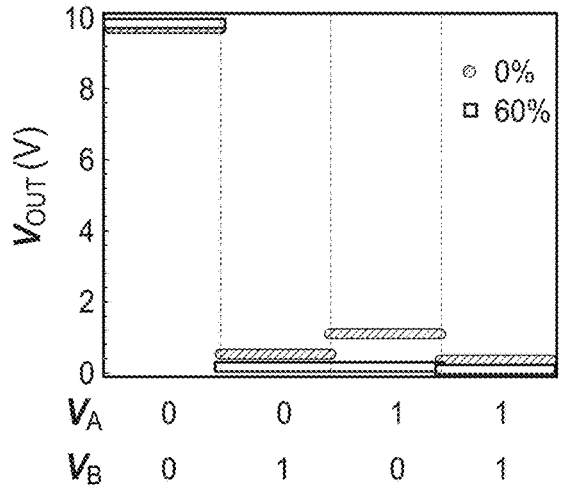
FIGS. 9D and 9E illustrate output characteristics of the NOR gate (FIG. 9D) and NAND gate (FIG. 9E) measured at a $V_{DD}$ of 10 V while the device is at pristine state (0% strain, blue circles) and stretched to 60% strain (red squares) along the channel length direction of the driving TFTs. For both NOR gate and NAND gate, input voltages of 80 V and 0 V are treated as logic "1" and "0", respectively.
Figure 9E:
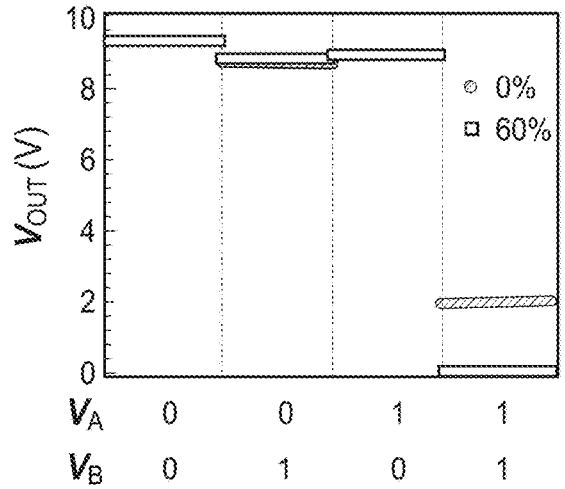
Figure 10B:
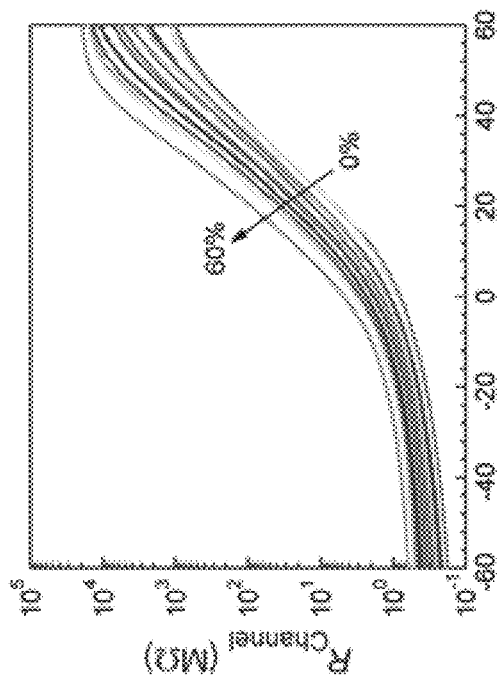
FIGS. 10A and 10B are plots of changes in the load resistance (FIG. 10A) and the channel resistance of the driving TFT (FIG. 10B) while an inverter of a TNT is stretched to 60% strain.
Figure 10D:
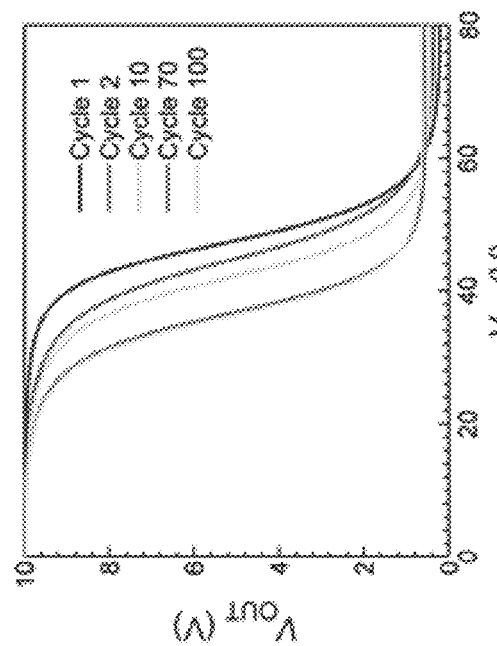
FIG. 10D is a plot of inverter VTCs measured at 50% strain during various stretching cycles.
Figure 10A:
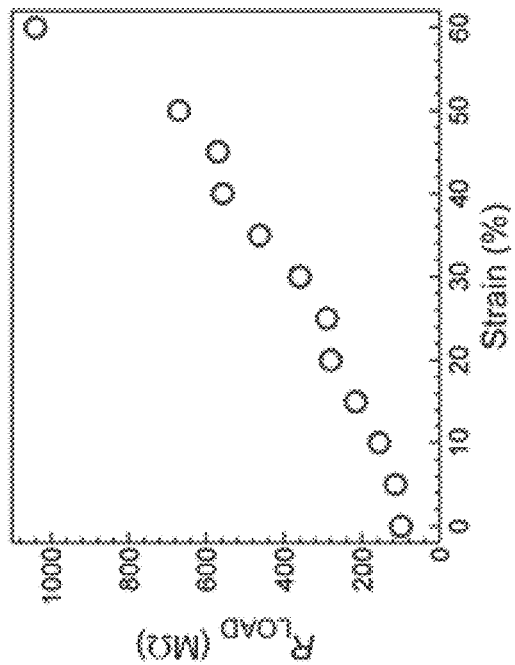
Figure 10C:
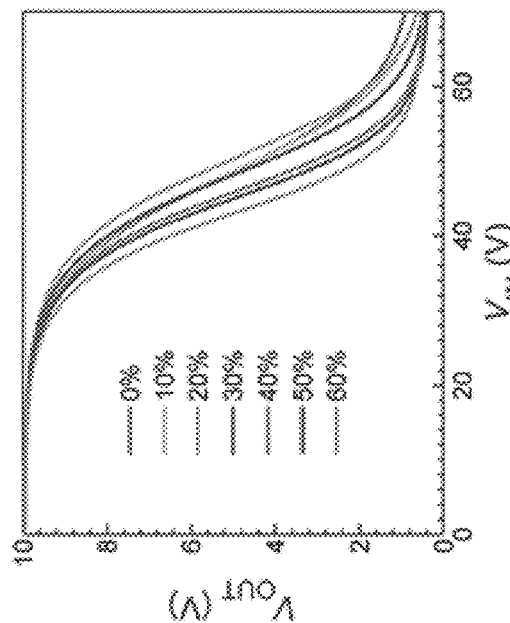
FIG. 10C is a plot of calculated inverter VTCs at various tensile strain values.
Figure 11B:
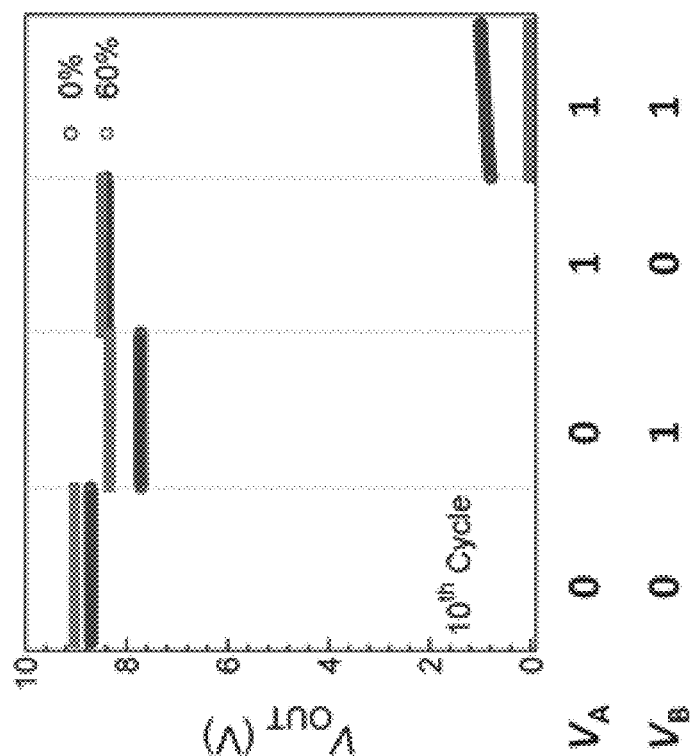
FIG. 11A is a plot of output characteristics of a NOR gate measured during the $1870^{th}$ stretching cycle and FIG. 11B is a plot of output characteristics of a NAND gate measured during the $10^{th}$ stretching cycle, in accordance with an example implementation.
Figure 11A:
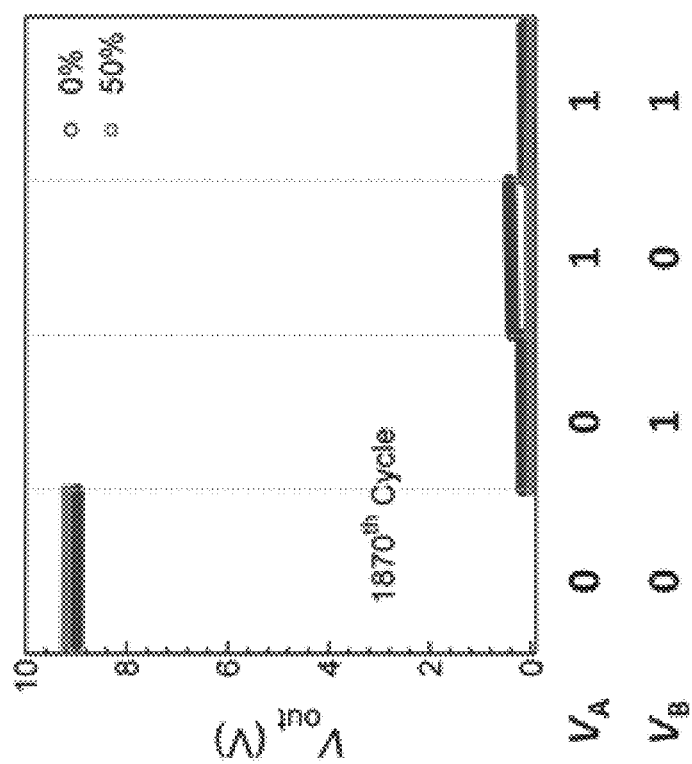

FIGS. 9D and 9E present the output characteristics of the 2-input NOR gate and NAND gate measured with a $V_{DD}$ of 10 V, while the circuits are at pristine state (blue circles) and under 60% strain (red squares) along the channel length direction of the driving TFTs. As expected, the NOR and NAND gates both function properly by showing unambiguous output logic "1" and "0" states. Furthermore, the contrast between the two logic states becomes even more pronounced when the circuits are stretched to 60% strain due to the significantly improved on/off current ratio of the driving TFTs. Lastly, the NOR and NAND gates both exhibit very stable electrical performance during repeated stretching tests, as depicted FIGS. 11A and 11B.

In summary, by materials and ink formulation development, we have successfully demonstrated intrinsically stretchable thin-film transistors and integrated logic circuits on PDMS using an all-printing process. The devices and circuits can withstand thousands of stretching cycles with tensile strain exceeding 50% along any directions while maintaining respectable and stable electrical performance. The present techniques provide an approach to realize low-cost and large-area fabrication of stretchable electronics, for a wide range of applications in wearable electronics or printed stretchable displays. The electrical performance, stretchability, and stability of devices formed herein may be improved by optimizing the channel semiconductor, gate dielectric layer and substrate.

Additionally, other semiconducting materials like P3HT (poly(3-hexylthiophene-2,5-diyl)), layered $MoS_2$ (Molybdenum disulfide) and $SnO_2$ (Tin dioxide) nanowires may be used as the channel material for stretchable TFTs, in place of carbon nanotubes.

Using surfactant-free inks with longer nanotubes can be used to diminish the number of intertube junctions and reduce the tube-to-tube junction resistance, which could further improve the device mobility towards that of individual carbon nanotubes.

Furthermore, using longer nanotubes may be beneficial to the improvement of stretchability.

As for the dielectric materials, higher permittivity is needed to further lower the operating voltage. Composite dielectric with carbon nanotube as fillers at a concentration near the percolating threshold shows gigantic permittivity may be used in some examples.

As for the substrate, although PDMS is widely used for stretchable electronics, its intrinsic hydrophobicity may complicate the printing process, in some examples; and the brittle silica skin formed on its surface after $O_2$ plasma treatment is prone to form microscopic cracks. Additionally, PDMS also has high $O_2$ and $H_2O$ permeability, which could compromise the stability of light-emitting devices under ambient conditions. Therefore, alternative elastomeric substrates with easy-handling surface and low gas permeability may be used to simplify the fabrication process and to improve the device stability.

The present techniques may be used to develop stretchable light-emitting devices, sensors and actuators, as well as circuit design and integration of these elements into more sophisticated circuits and smart systems.

Methods

Materials: Polydimethylsiloxane (Sylgard 184, 10:1) slabs with a thickness of ~0.5 mm were prepared as the stretchable substrates. High purity semiconducting carbon nanotubes (IsoNanotubes-S™ 98%, 0.01 mg/ml, NanoIntegris) were used as the channel semiconductor. Highly functionalized unsorted carbon nanotubes (P3-SWNT, Carbon Solutions, Inc) were used for the source, drain and gate electrodes of the TFTs. Barium titanate nanoparticles ($BaTiO_3$, 99%, 50 nm, cubic), Triton™ X-100 (laboratory grade) and poly-L-lysine (0.1% w/v in water), and 4-Methyl-2-pentanone (99%) were purchased from US Research Nanomaterials, Sigma-Aldrich and Alfa Aesar, respectively.

Ink formulations: To prepare the inks for printed electrodes, 5 mg of P3-SWNT carbon nanotube powder was dissolved in DI water by successive bath sonication (Crest CP360D, power level 9, 3 hours) and probe sonication (VirTis VirSonic 100, 10 W, 5 min) followed by ultracentrifugation (13,000 rpm, 1 hour) to remove remaining agglomerations. 0.1% wt. Triton X-100 was finally added into the solution to facilitate the printing on PDMS. The ink for hybrid gate dielectric was prepared by first mixing PDMS (base only), $BaTiO_3$ nanoparticles, and 4-methyl-2-pentanone followed by magnetic stirring for 30 min. The mixture was then subjected to successive bath sonication (power level 9, 4 hours) and probe sonication (15 W, 10 min) to break the large aggregations of $BaTiO_3$. The weights of PDMS and 4-methyl-2-pentanone were fixed at 1 g and 4 g, respectively, while the weight of $BaTiO_3$ was varied from 0.5 g to 2 g. Lastly, 0.3 g of curing agent was added to the dispersion before printing.

Device fabrication: The surface of PDMS substrate was rendered hydrophilic by $O_2$ plasma treatment (30 W, 500 mTorr, 3~5 s), followed by functionalization with poly-L-lysine (10 min). Semiconducting carbon nanotube network was then deposited by drop-casting for 30 min. The substrate was then rinsed with deionized water to remove excessive surfactant followed by blow dry with $N_2$. Source/drain electrodes (usually ~200-300 μm wide) were subsequently patterned by printing P3-SWNT solution on the substrate for 40~50 layers at 60° C. using a Sonoplot Microplotter equipped with micropipettes with ~100-150 μm openings. The TFT channels were then defined by patterning the sSWCNT network by $O_2$ plasma etching (60 W, 40 s) with the channel protected by printed S1813. After removing S1813 by acetone rinsing, PDMS/$BaTiO_3$ gate dielectric was subsequently printed and cured at 150° C. for 20 min. Finally, P3-SWNT ink was printed on top of the gate dielectric layer for 20-30 layers at 60° C. as the top gate electrode. This concludes the fabrication of stretchable TFTs. For the logic circuits, P3-SWNT ink was printed into the channel region of the load resistor in a layer by layer fashion until an optimal resistance value was achieved. After printing all components and achieving the desired performance, a PDMS layer was printed as encapsulant.

Characterizations: The electrical characteristics of TFTs and logic gates were measured by an Agilent B1500A Semiconductor Parameter Analyzer. Resistance of the printed CNT electrodes were measured by a Keithley 2100 multimeter controlled by a LabView program. The gate dielectric layer material was characterized by the CV module (B1520A) of the Agilent B1500A analyzer. Stretching tests were performed automatically with a syringe pump. Scanning electron micrographs, atomic force micrograph and optical micrographs were captured with a Hitachi S-4700II field emission scanning electron microscope (FE-SEM), a Dimension 3100 atomic force microscope (AFM) and an Olympus BX51 optical microscope, respectively. All measurement was conducted under ambient conditions.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components or multiple components. For example, references and illustrates herein to a "motion capture device," motion capturing hardware device, and the like, include references to multiple ones of these devices as may be used attached to and/or separately spaced from a user. These and other variations, modifications, additions, and improvements fall within the scope of the subject matter herein.

Additionally, certain embodiments are described herein as including logic or a number of routines, subroutines, applications, or instructions. These may constitute either software (e.g., code embodied on a machine-readable medium or in a transmission signal) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a microcontroller, field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules can provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connects the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it is communicatively coupled. A further hardware module may then, at a later time, access the memory device to retrieve and process the stored output. Hardware modules may also initiate communications with input or output devices, and can operate on a resource (e.g., a collection of information).

The various operations of the example methods described herein can be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method can be performed by one or more processors or processor-implemented hardware modules. The performance of certain of the operations may be distributed among the one or more processors, not only residing within a single machine, but also deployed across a number of machines. In some example embodiments, the processor or processors may be located in a single location (e.g., within a home environment, an office environment or as a server farm), while in other embodiments the processors may be distributed across a number of locations.

The performance of certain of the operations may be distributed among the one or more processors, not only residing within a single machine, but also deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description, and the claims that follow, should be read to include one or at least one and the singular also includes the plural unless it is obvious that it is meant otherwise.

This detailed description is to be construed as an example only and does not describe every possible embodiment, as describing every possible embodiment would be impractical, if not impossible. One could implement numerous alternate embodiments, using either current technology or technology developed after the filing date of this application.

What is claimed:
1. A thin-film device comprising:
   a stretchable elastomer substrate; and
   one or more thin-film transistor elements comprising a source electrode, a drain electrode, and a gate electrode each formed of carbon nanotubes (CNTs) and comprising a stretchable hybrid gate dielectric, the one or more thin-film transistor elements each being printed on the stretchable elastomer substrate and forming one or more stretchable thin-film transistor elements;

wherein the hybrid gate dielectric comprises barium titanate (BaTiO3) nanoparticles dispersed in polydimethylsiloxane (PDMS) as a gate insulator; and wherein the BaTiO3 nanoparticles are cubic phase BaTiO3 nanoparticles.

2. The thin-film device of claim 1, wherein the BaTiO3 nanoparticles have a particle size of 50 nm.

3. The thin-film device of claim 1, wherein at least some of the carbon nanotubes extend between the source electrode and the drain electrode and comprise semiconducting single-walled carbon nanotubes.

4. The thin-film device of claim 1, wherein the carbon nanotubes of the source electrode, the drain electrode, and the gate electrode are unsorted carbon nanotubes.

5. The thin-film device of claim 1, further comprising a PDMS encapsulation layer encapsulating the one or more stretchable thin-film transistor elements.

6. The thin-film device of claim 1, wherein the one or more stretchable thin-film transistor elements are stretchable beyond a 50% strain along a channel length.

7. The thin-film device of claim 6, wherein the one or more stretchable thin-film transistor elements are stretchable beyond a 60% strain along the channel length.

8. The thin-film device of claim 6, wherein the one or more stretchable thin-film transistor elements are stretchable beyond a 100% strain along the channel length.

9. The thin-film device of claim 1, wherein the one or more stretchable thin-film transistor elements are stretchable beyond a 50% strain along a channel width.

10. The thin-film device of claim 9, wherein the one or more stretchable thin-film transistor elements are stretchable beyond a 60% strain along the channel width.

11. The thin-film device of claim 7, wherein the one or more stretchable thin-film transistor elements are stretchable beyond a 100% strain along the channel width.

12. The thin-film device of claim 1, wherein the one or more thin-film transistor elements are connected to form an inverter.

13. The thin-film device of claim 1, wherein the one or more thin-film transistor elements are connected to form a NOR gate.

14. The thin-film device of claim 1, wherein the one or more thin-film transistor elements are connected to form a NAND gate.

15. The thin-film device of claim 1, comprising a plurality of stretchable thin-film transistor elements, wherein the plurality of stretchable thin-film transistor elements comprises an inverter, a NOR gate, and/or a NAND gate.

16. The thin-film device of claim 1, wherein the stretchable elastomer substrate is a polydimethylsiloxane (PDMS) substrate, a silicone substrate, a polyurethaneacrylate (PUA) substrate, or a thermoplastic elastomer (TPE) substrate.

* * * * *